United States Patent [19]
Jalbert

[11] 4,378,552
[45] Mar. 29, 1983

[54] ACOUSTIC ENCODING APPARATUS

[75] Inventor: Vincent P. Jalbert, Middlebury, Conn.

[73] Assignee: SCM Corporation, New York, N.Y.

[21] Appl. No.: 87,854

[22] Filed: Oct. 24, 1979

Related U.S. Application Data

[63] Continuation of Ser. No. 853,778, Nov. 21, 1977, abandoned.

[51] Int. Cl.³ .......................... G06F 3/02; H04L 15/03
[52] U.S. Cl. .................................. 340/365 R; 73/584;
310/323; 310/328; 310/339; 340/365 A; 340/365 S
[58] Field of Search .......................... 400/479; 73/584;
340/365 R, 365 A, 365 S; 310/323, 328, 339; 178/17 C

[56]  References Cited
U.S. PATENT DOCUMENTS

| | | | |
|---|---|---|---|
| 3,134,099 | 5/1964 | Woo | 340/347 |
| 3,353,038 | 11/1967 | Mason et al. | 340/365 A |
| 3,464,531 | 9/1969 | Herr et al. | 340/365 A |
| 3,647,962 | 3/1972 | Whetstone | 340/365 S |
| 3,725,908 | 4/1973 | Brisebarre et al. | 340/365 A |
| 3,846,580 | 11/1974 | Brenner | 178/19 |
| 3,976,899 | 8/1976 | Fanshawe | 340/365 A |

FOREIGN PATENT DOCUMENTS

| | | | |
|---|---|---|---|
| 1348007 | 3/1974 | United Kingdom | 340/365 R |
| 1361057 | 7/1974 | United Kingdom | 340/365 R |
| 1386070 | 3/1975 | United Kingdom | 340/365 R |

OTHER PUBLICATIONS

"Electronic Keyboard", Lisk, IBM Technical Disclosure Bulletin, Jun. 1977, p. 259.
"Ripple-Sensing Keyboard", Arosenius, IBM Technical Disclosure Bulletin, Mar. 1972, p. 3199.
"Acoustical Touch Panel", Fajans, IBM Technical Disclosure Bulletin, Dec. 1977, p. 2925.
"Accoustically . . . Wire," Booth et. al., IBM Technical Disclosure Bulletin, Mar. 1978, p. 4188.

Primary Examiner—James J. Groody
Attorney, Agent, or Firm—Armand G. Guibert; Milton M. Wolson

[57]  ABSTRACT

Encoding apparatus for a business machine includes a resilient striker for inducing diverging sound waves within a rod by impact with it at a given location. Transducers positioned along the rod on each side of the striker and at unequal distances from it, convert the sound wave fronts into a first and a second output signal having a predetermined time interval between them which is dependent upon the location of impact with the rod. The transducers are connected to a logic unit which includes an oscillator-driven binary counter. The first output signal starts the counter and subsequent arrival of the second output signal determines the elapsed time, the counter output at that instant being a binary code value usable for any desired purpose: control, display, etc. The encoding apparatus may be incorporated in a keyboard having a number of keys and a corresponding number of strikers differentially positioned along the rod such that each key produces output signals with a predetermined time interval between them and accordingly a unique binary code may be obtained upon actuation of each key.

29 Claims, 23 Drawing Figures

FIG.—1

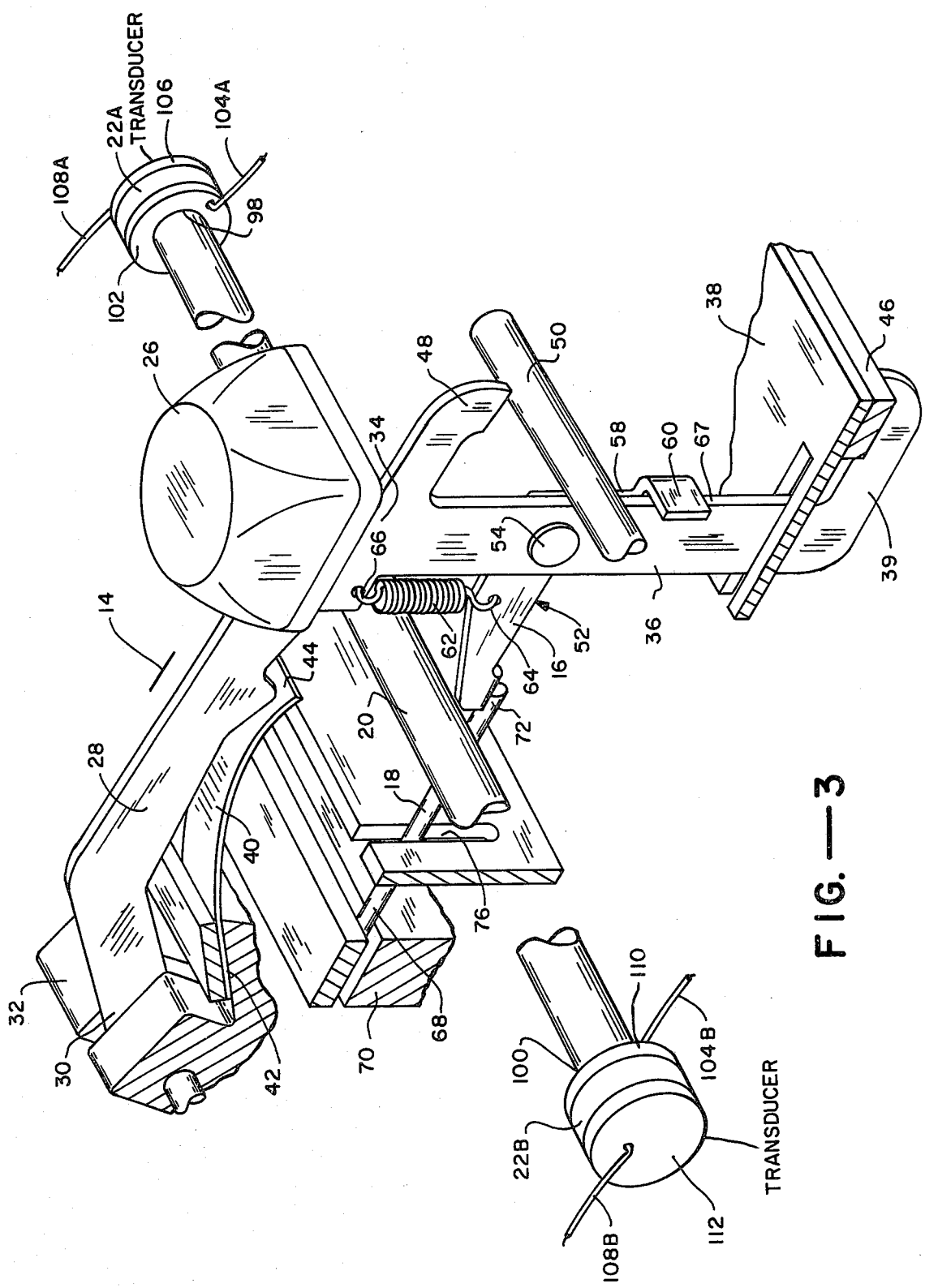
FIG.—3

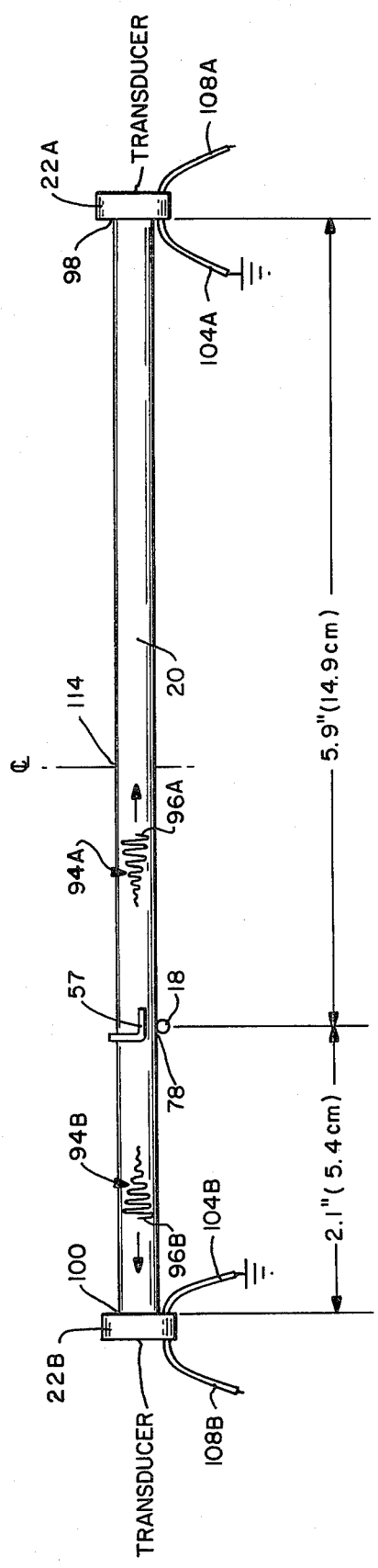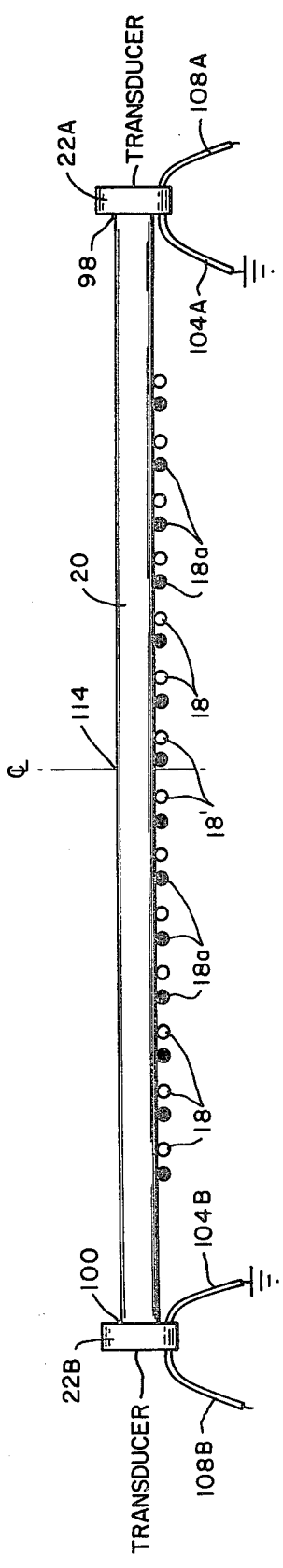

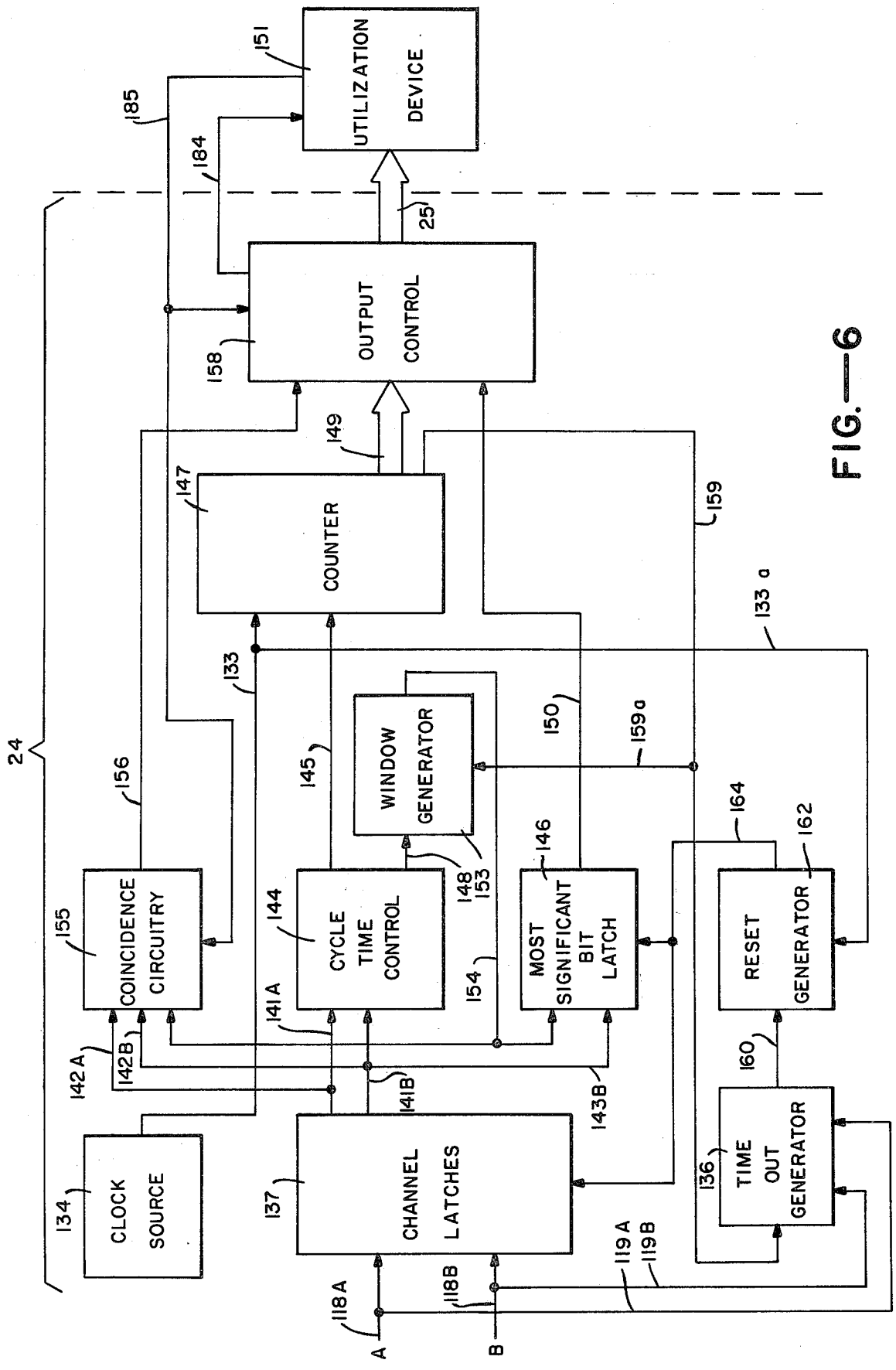
FIG.—6

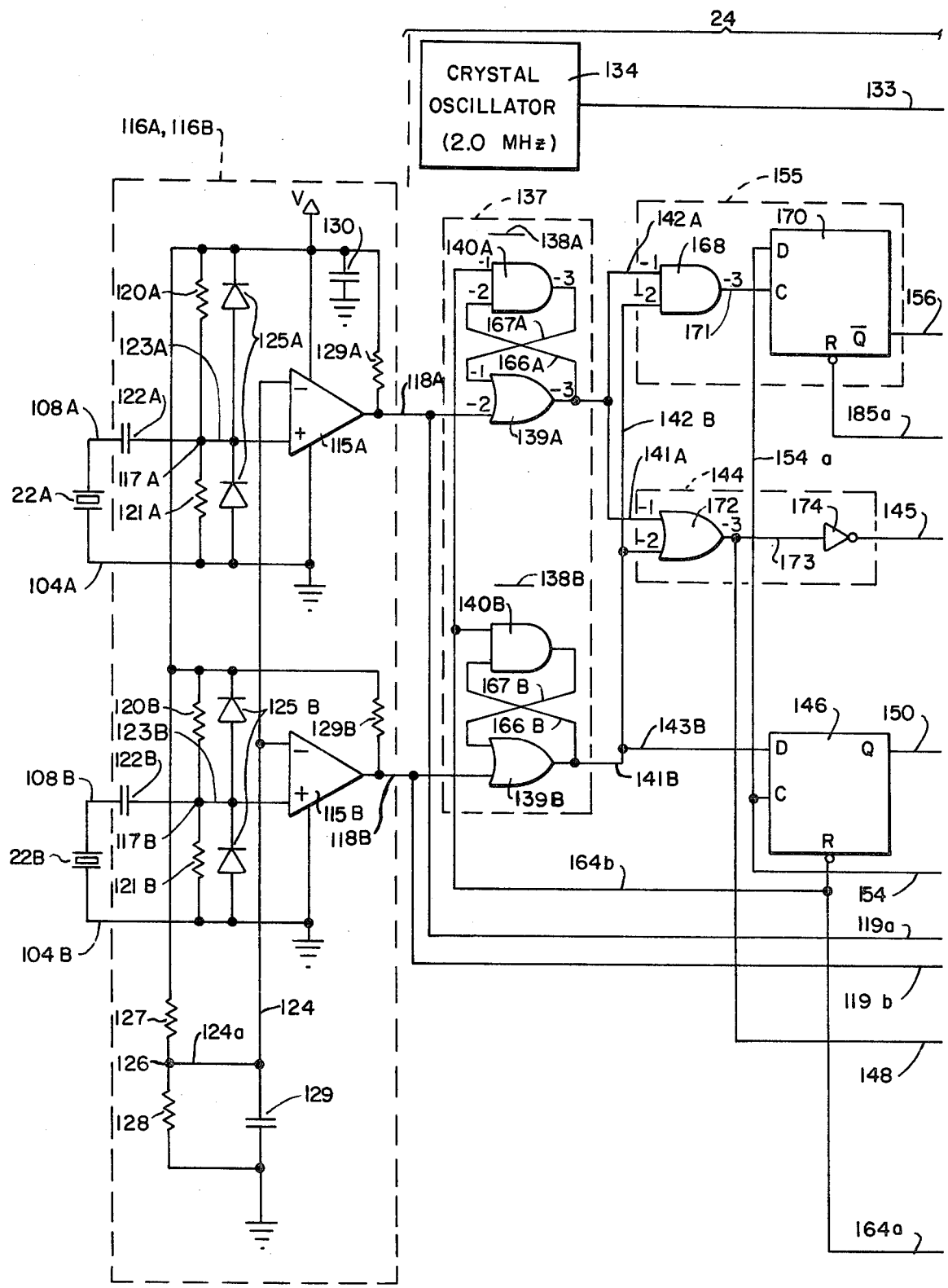
FIG.—7A

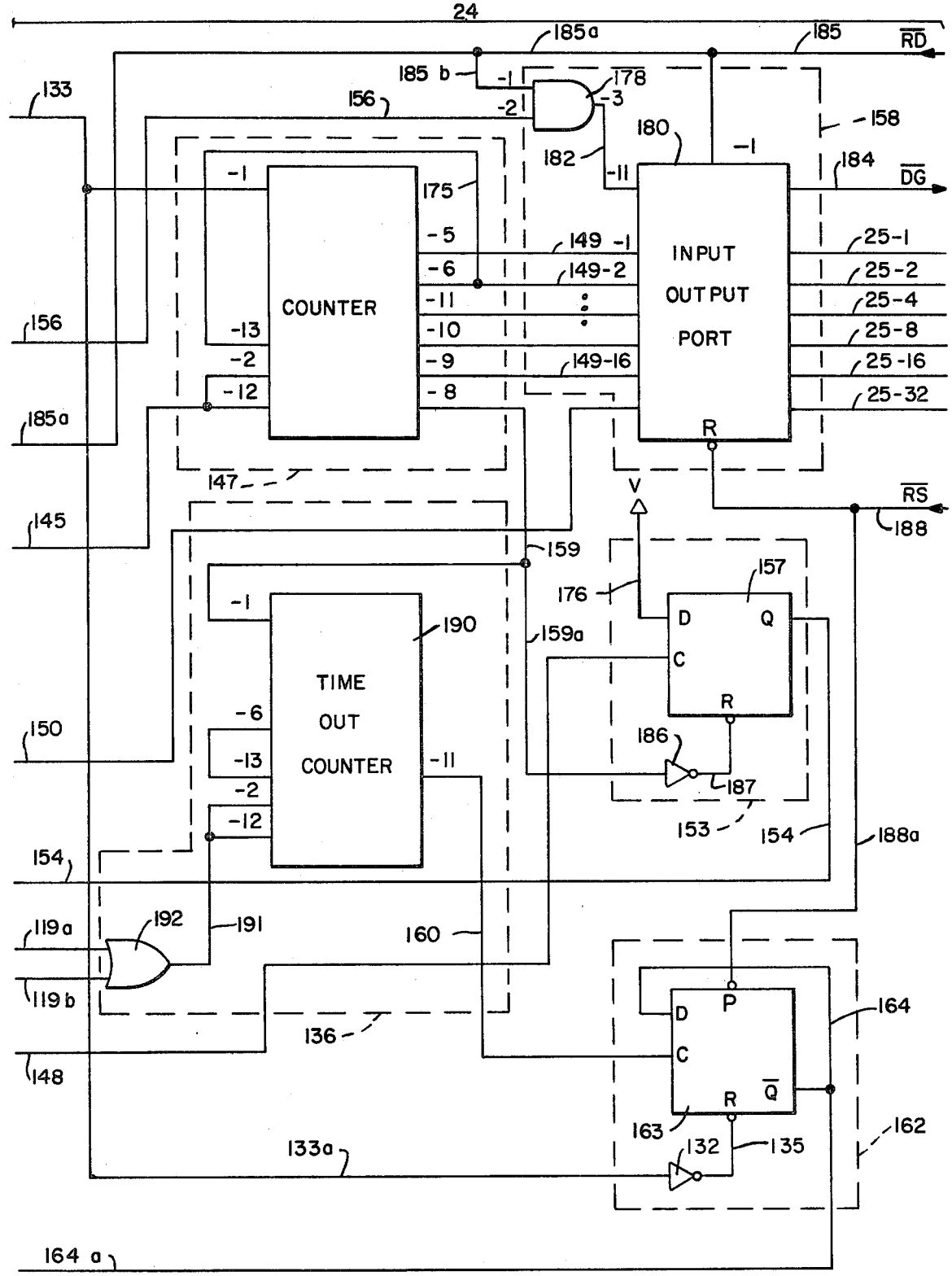
FIG.—7B

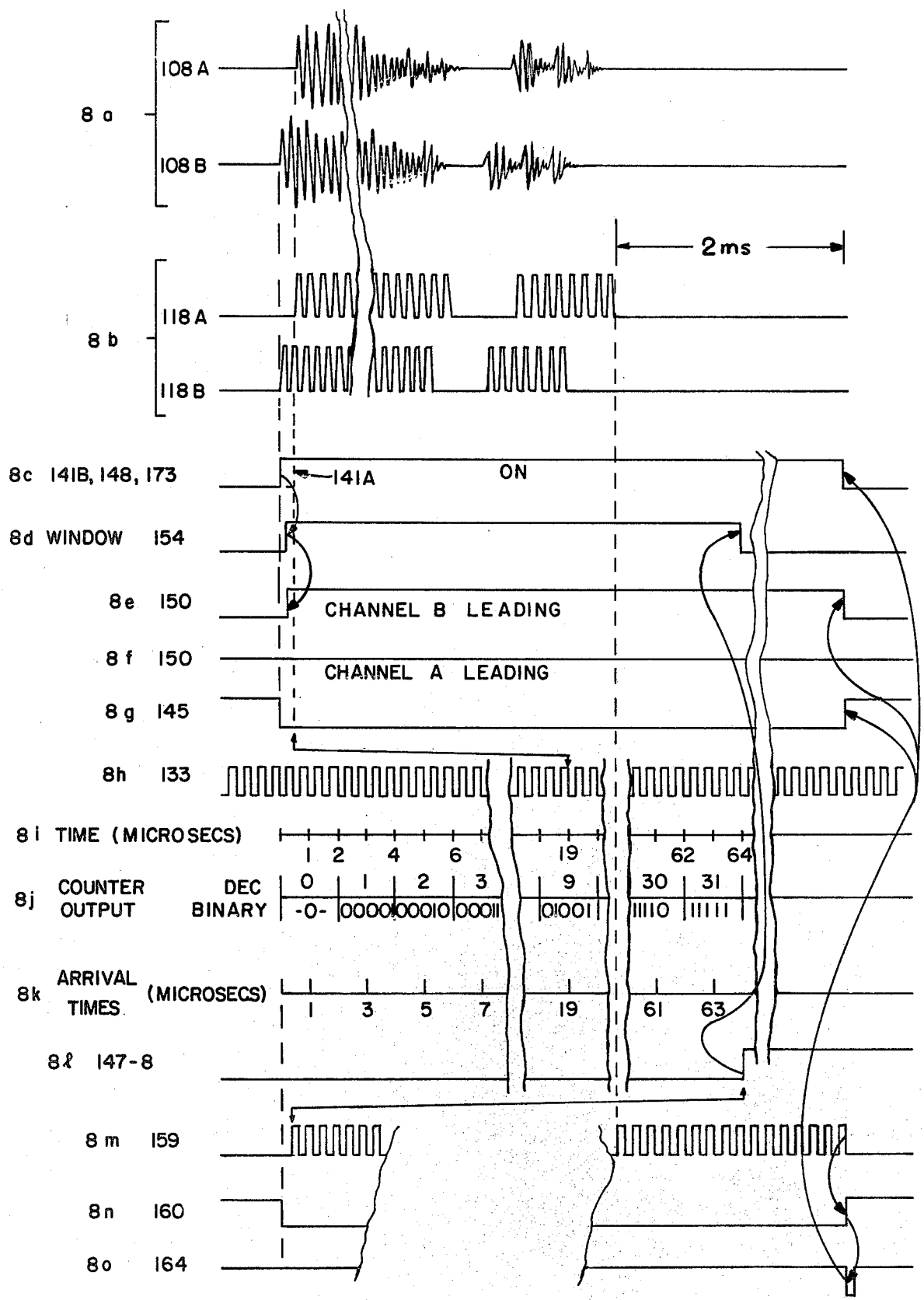
FIG.—8

ACOUSTIC ENCODING APPARATUS

This is a continuation of application Ser. No. 853,778, filed Nov. 21, 1977, now abandoned.

BACKGROUND OF THE INVENTION

1. Field of the Invention

The present invention relates to encoding apparatus for business machines such as typewriters, teletypewriters, calculators, adding machines, cash registers, etc. and periheral equipment such as computer terminals, keyboard modules, and the like. More particularly it relates to encoding apparatus for keyboards having sound generating keys coupled with electronics for determining the key depressed by the keyboard operator.

2. Description of the Prior Art

To satisfy the increasing demands and requirements of modern business machines, the trend of manufacturers has been to reduce or eliminate mechanical arrangements for control and data input by introduction of equivalent electronic components and circuitry. The electronic keyboard, in particular, is an approach which is desirable because of the simplicity and reliability of the few moving parts required and elimination of adjustments due to wear. For these reasons, electronic keyboards are more economical because of the significantly reduced manufacturing cost. Another advantage of electronic controls and keyboards in particular is that the space formerly occupied by bulky mechanisms is no longer needed, the great reduction in space requirements thus allowing for a more compact and lighter machine. Also, electronic keyboards easily increase the versatility of business machines because use of larger scale integrated circuits permits increasing functional capabilities at little added cost.

Many prior art business machines employ mechanical switches for sensing mechanical actions, e.g. key depressions in electrical keyboards. This arrangement is undesirable because the switches are subject to wear during use, to atmospheric attack on the contact material and to dirt build up on the contact faces—all of which affect the electrical resistance. To overcome the problem of contact wear and susceptibility to atmospheric attack, manufacturers have had to employ contacts made of a noble metal such as gold at substantial increase in manufacturing expense. The problem of dirt and dust can only be avoided by enclosing the contacts which again adds to the cost.

Bounce is another major problem encountered with the use of switch contacts, it being difficult to eliminate entirely in conventional switches by mechanical design alone. Antibounce circuitry has been introduced as one way to eliminate bounce, but this adds to the complexity of the design with corresponding increase in cost.

The above problems have inspired designs of more elaborate keyboard circuitry employing arrays of devices such as Hall Effect switches, miniature transformers, piezoelectric elements and variable capacitors—many of which eliminate bounce and have a long life. The disadvantages of such circuitry are substantial. The arrays all require many individual transducers mounted on a printed circuit board, one transducer being needed at each key station. Further, these prior art keyboards require many inter-connections as well as many repetitive sensing circuits. For these reasons such keyboard designs have proved complex and expensive.

Another approach in keyboard design is the photoelectric keyboard. Such keyboards typically comprise a matrix of channels and orthogonal grooves with a light source at one end of each channel and a photocell at the other end. Shutters are provided in the grooves for selectively intercepting light beams in the individual channels. Interception of the light beams de-energizes the photocells and, through appropriate circuitry, conveys an information signal. A disadvantage of this keyboard apparatus is that the matrix of channels and grooves is complex and difficult to manufacture. Another disadvantage is that the light sources and photocells must be accurately aligned, which results in costly assembly time.

Accordingly, there is still a need for a low-cost encoding apparatus, one particularly suitable for use with keyboards.

SUMMARY OF THE INVENTION

The present invention sets forth a method and encoding apparatus in which vibratory energy (which may be acoustic or sound energy) is induced for generating an output representative of a mechanical motion. The apparatus includes a member for transmitting vibratory energy, means operable in response to the mechanical motion and effective to induce vibratory energy within the member in the form of separate wave fronts travelling in diverging directions, means operatively connected to the member for transducing the wave fronts into signals with an elapsed time between arrival of these signals, and means connected to the transducing means and operable to generate from the elapsed time an output representative of the mechanical motion.

In a particular form, the encoding apparatus includes a rod for providing different distances for the wave fronts to travel in the diverging directions, a striker for impacting the rod at a particular point, and transducers connected to the rod and positioned appropriately on either side of the point at which the striker impacts the rod such that induced sound waves are sensed by the transducers at different times. The transducers each convert the sound waves into a corresponding electrical output signal, the sound wave transmitted over the shorter distance being transduced into a first signal (i.e. the "leading" signal). After a predetermined elapsed time, the other sound wave—that transmitted over the longer distance—is transduced into a second signal (i.e. the "following" signal). Circuitry connected to the transducers measures the elapsed time between these two signals and a code is then generated from the elapsed time. More particularly, the encoding apparatus may be associated with one or more depressible keys, in which case the code generated is representative of depression of the one key, or a selected one of many keys.

Accordingly, an object of the present invention is to provide an encoding method and apparatus that utilizes acoustic energy.

Another object of the present invention is to provide encoding apparatus that is easily adaptable to the many kinds of machines using a keyboard.

A further object of the present invention is to provide an encoding keyboard that is of simple construction, having few moving parts.

A further object of the present invention is to provide an encoding keyboard that is efficient, reliable, rapid in response, low in manufacturing cost and extremely easy to assemble.

Other objects, features and advantages will become more apparent from the following description, including appended claims and accompanying drawing.

BRIEF DESCRIPTION OF THE DRAWINGS

FIG. 3 is an enlarged perspective view of the key mechanism associated with a portion of the apparatus.

FIG. 4 is a front elevation view of the acoustic rod portion of the apparatus with a single striker located at a given position and showing the sound waves induced by striker impact.

FIG. 5 is a front elevation view of a portion of the apparatus, illustrating different embodiments of multiple striker positions along a rod.

FIG. 6 is a block diagram of the logic portion of the apparatus.

FIGS. 7a and 7b are a detailed schematic of the electronic portion of the apparatus including the logic elements of FIG. 6 and signal conditioning circuitry.

FIGS. 8a-8o present individual portions of a timing diagram illustrating the generation of various signals and related codes by the elements of FIGS. 6 and 7. FIGS. 8d and 8h to 8l are on an expanded time scale for greater clarity.

DESCRIPTION OF THE PREFERRED EMBODIMENTS

Figure 1:
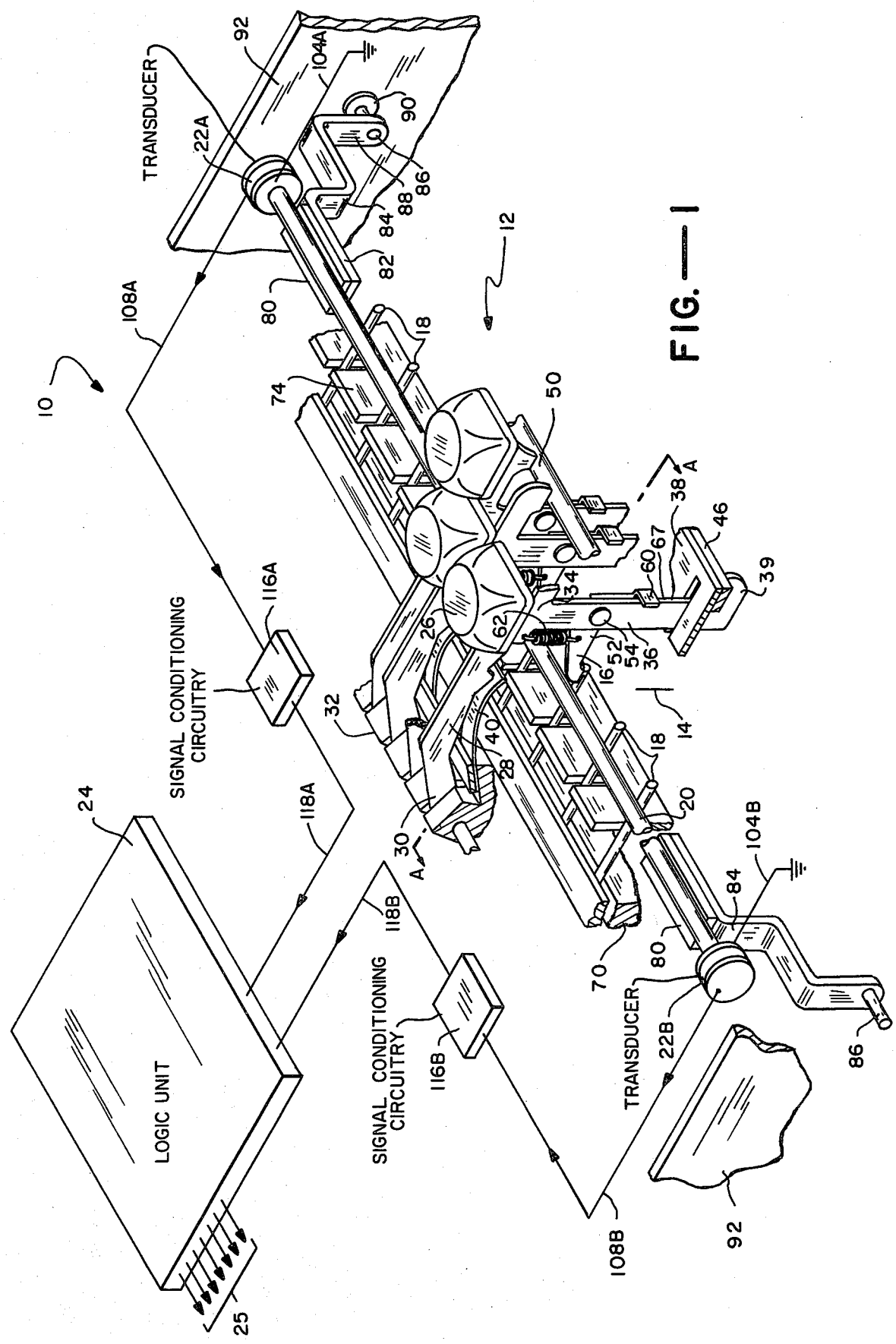
FIG. 1 is a perspective view of the encoding apparatus associated with a keyboard mechanism having electronic and logic circuitry connected thereto as an embodiment of the present invention.

Referring to the drawings and more particularly to FIG. 1, it is shown that, in general, a code generating or "encoding" apparatus 10, according to the present invention, includes an actuator 16, a sound wave or "acoustic" wave inducer 18, an acoustic member 20 in which diverging sound waves may be propagated by the inducer 18 in response to the actuator 16; transducing means 22A, 22B for converting the sound waves into a pair of electrical signals, the transducing means being so located with respect to the diverging waves that each electrical signal of the pair is produced at a different time; and a logic unit 24 for producing a code representative of the time difference. While the acoustic system is shown in FIG. 1 as a resilient striker 18 for delivering an impact to an elongated member 20 adjacent to it, other implementations are possible, e.g., a pulsed electromagnet could be used to induce compression waves in a magnetostrictive element closely coupled to it. Resilient striker 18 may be in the form of a cantilevered spring fixed at one end in a frame and deflectable at the other end by the actuator 10, which may be associated for example with a keybutton 26 of a keyboard 12. The elongated acoustical member 20 may be a long rod (as it will be termed hereafter for convenience) extending perpendicular to the striker 18 for optimum performance. Striker 18 is normally at a rest position against rod 20, but is engageable with actuator 10 when keybutton 26 is depressed by an operator. Through the action of a key mechanism 14, depression of the keybutton 26 only flicks the striker 18—that is, momentarily deflects striker 18 and then releases it. After striker 18 has been released, stored flexural energy returns it to the normal position, giving rod 20 a sharp blow in so doing. The impact with rod 20 induces sound energy within it in the form of diverging sound waves. Transducer devices 22A, 22B are operatively connected to rod 20, one of each side of striker 18, for converting the sound waves into electrical output signals. The transducer devices 22A, 22B are positioned along rod 20 at unequal distances from striker 18. Therefore, sound waves originated by a single impact or blow from striker 18 are transduced into output signals by transducers 22A and 22B at different times. The sound wave traveling over the shorter distance is transduced into a first output signal hereinafter referred to as the "leading signal", and the sound wave traveling over the longer distance is transduced into a second output signal, hereinafter referred to as the "following signal". For a given location of the striker, there is a known time interval between the two outputs since the velocity of sound is a constant for a given material so long as temperature remains substantially unchanged. The elapsed time between the leading and following signals is measured by circuitry including the logic unit 24 connected to the transducing means 22A, 22B by their output lines 108A, 108B. Arrival of the leading signal at the logic unit 24 starts the time measuring and arrival of the following signal at logic unit 24 causes the elapsed time between signals to be determined, a corresponding code then being made available on lines 25 for display or recording in a utilization device or for control of such device. The code generated in correspondence with the measured time interval is broadly a representation of occurrence of a mechanical motion. More narrowly, the code produced by the time measuring circuitry may be representative of a selected key of the above-mentioned keyboard 12. For example, as shown in FIG. 1, each key 26 of keyboard 12 is associated with an individual striker 18 which is differentially positioned along the elongated rod 20 in a way such that each striker 18 has a unique differential distance relation with the transducing means (with use of appropriate discriminating means under conditions of symmetry, as will be seen). Therefore, the time interval for generating a representative code can be made unique for each key.

As seen in FIG. 1, the electronic arrangements include signal conditioning circuitry 116A, 116B, connected between a respective one of the transducer outputs 108A and 108B and the logic unit 24 provided for measuring the elapsed time and producing a corresponding code. The signal conditioning circuitry 116A, 116B is necessary to ensure compatibility with the type of integrated circuits chosen for implementation of logic unit 24, as more fully explained subsequently. The path of the signal from the transducer output 108A to the logic unit input line 118A which includes signal conditioning circuitry 116A is herein defined as Channel A for convenience. Similarly, the path of the signal from the output 108B to the logic unit input line 118B which includes conditioning circuitry 116B is herein defined as Channel B.

Figure 2:
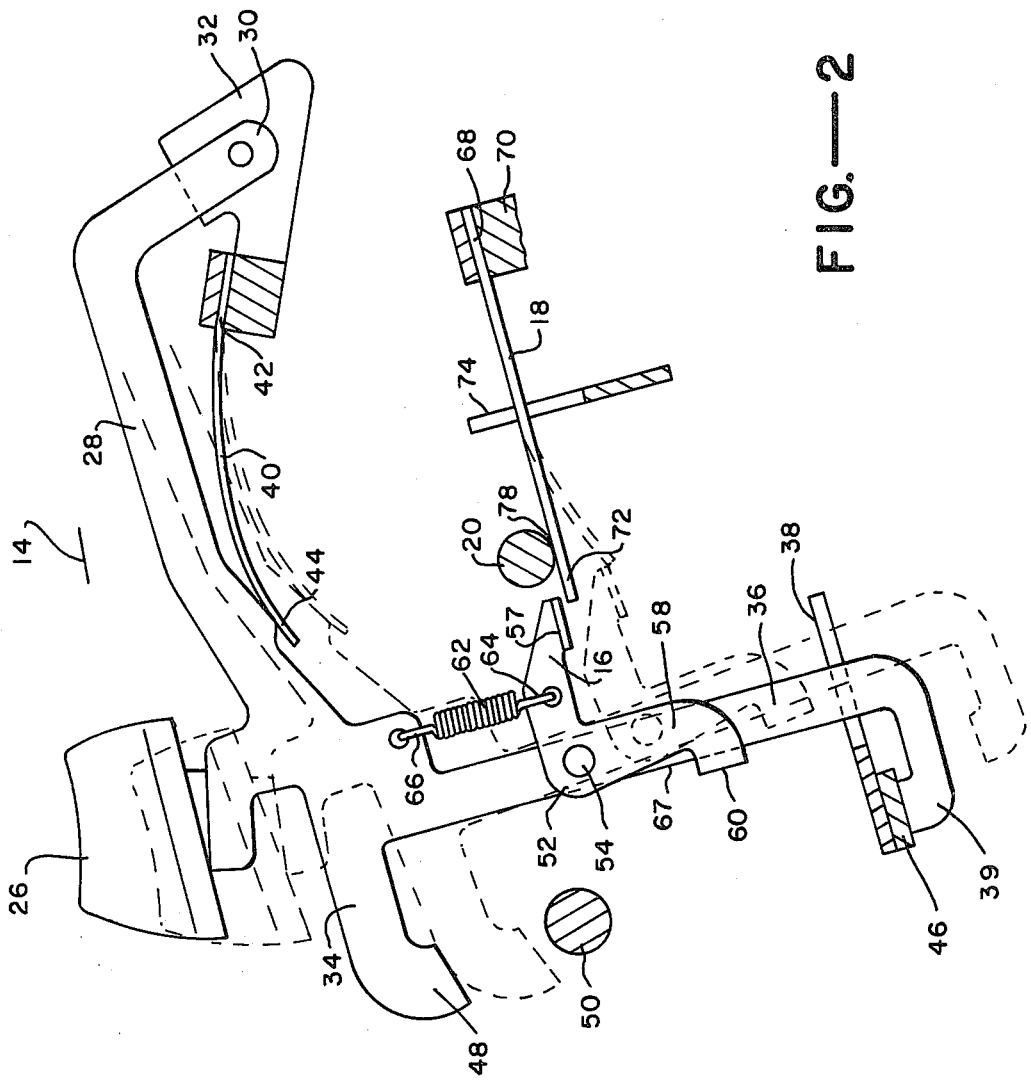
FIG. 2 is a sectional right side elevation along section A—A of FIG. 1 with solid lines showing the key mechanism and its relation to a sound-inducing striker at rest position and dotted lines showing the relation of the same parts just before release of the striker after it has been engaged by the key mechanism during a key depression.

Referring now to FIGS. 2 and 3, there is shown one form of the key mechanism 14 for use in the keyboard 12 associated with the encoding apparatus 10 according to the present invention. It should be understood that other mechanisms could equally well be used. The key mechanism 14 includes a finger-engagable keybutton 26 mounted on a keylever 28, which keylever has one end 30 pivotally supported and guided within a slotted frame 32. The other end 34 of keylever 28 has a right angle extension 36 projecting downward through a guide frame 38 for stabilizing keylever 28 during key depression. Extension 36 is terminated at its lower end by an upstop arm 39 which abuts against an upstop 46 when keylever 28 is in a normal rest position (solid lines in FIG. 2). A leaf spring 40 has one end 42 secured to frame 32, and the other end 44 extends beneath keylever 28 to engage it and urge it to the rest position. Similarly, a downstop arm 48 extends forward (this term being used in the context of the keyboard 12 being at the front of the machine as is usual) from extension 30 at a point beneath keybutton 26 for abutment with a downstop 50 when keylever 28 is depressed. Actuator 10 is provided on extension 36 of keylever 28 for operative movement of striker 18 and comprises one arm 16 (as it will be termed hereinafter) of a bellcrank 52 pivotally mounted at 54 on extension 36, the other arm 58 of bellcrank 52 projecting downward and terminating in a form 60 normally resting against an edge 67 of extension 36. A tension spring 62 has one end 64 hooked on the arm 16 of bellcrank 52 and the other end 66 hooked on keylever 28. Spring 62 thus urges bellcrank 52 in a clockwise direction (as viewed in FIG. 2) such that form 60 is in its normal position.

Resilient striker 18 is supported in cantilever fashion, as mentioned earlier, with one end 68 rigidly clamped in a frame 70, the other end 72 being free. Free end 72 extends under rod 20 toward arm 16 of bellcrank 52, terminating substantially below an ear 57 formed on arm 16. Depression of keybutton 26 causes the ear 57 of arm 16 to engage with the free end 72 of striker 18. Resilience of striker 18 allows deflection from a first, or rest position (solid lines in FIG. 2) when actuated by arm 16 and restoration to that first position when released from arm 16 at a flexed position (dotted lines in FIG. 2). Resilient striker 18 may be an elongated wire and is preferably constructed from a spring steel material or an equivalent.

A guide member in the form of a comb 74 has slots 76 through each of which extends the free end 72 of a striker 18, there being preferably more than one striker when the acoustic encoding apparatus is associated with a keyboard. The purpose of comb 74 is the lateral alignment of the free end 72 of striker 18 with respect to ear 57 of arm 16 and the guidance of striker 18 during its vertical deflection. The guidance is necessary not only to prevent premature disengagement from arm 16 which might otherwise result upon sideways displacement, but to maintain orthogonality of the striker and rod at impact and precision of the impact position. Orthogonality of impact has been found to reduce any tendency toward asymmetry and unequal intensity of the induced wave front which could cause significant errors in time measurements, if uncontrolled. Variations in the impact position likewise affect the time measurements as is clear from the foregoing discussion.

As mentioned earlier, the acoustic member 20 is preferably an elongated rod arranged substantially perpendicular (orthogonal) relative to striker 18, resting near the free end 72 thereof so as to form a contact point 78 to the rear of arm 16. Because of this contact with rod 20, striker 18 is under a slight bending load which tends to reduce undesired bounce of striker 18 when impacting rod 20. The material and configuration of rod 20 are not critical, in general. The material selection for rod 20 is not restricted as long as the following characteristics are present. Rod 20 must be capable of propagating sound energy when induced, for example, upon impact by striker 18. Rod 20 must further be capable of sustaining sound energy in the form of sound waves within itself and transmitting these in divergent directions at a predeterminable, substantially constant velocity without excessive attenuation. For the embodiments of this invention, rod 20 may be, for example, a round metal rod having a diameter of 1/16 inch and preferably made of steel. Other metal alloys, glass or plastic would satisfy the material requirements, however, as is known from delay line art. Hollow, elongated members containing gases and liquids would also satisfy the material requirements. As to configuration, rod 20 may be any desired shape, although shown in the figures as a right circular cylinder. The circular form shown is merely one example of a suitable elongated member. Other forms of elongated members, such as a tube or a square bar, could equally well be used.

Referring back to FIG. 1, rod 20 is seen to be supported at each end such that it is acoustically isolated from external effects such as motor vibration or environmental shocks. The supporting structures at each end of rod 20 are identical, therefore only one need be described. Rod 20 rests on two pads 80 located near the extremities of rod 20, each pad 80 being constructed from a dampening material such as cork or plastic foam. The dampening material has little effect on the sound generated by the apparatus 10 since the sound waves are being transmitted within rod 20. Each pad 80 is affixed—as by an adhesive—to an upper surface 82 of a support bracket 84. A pin 86 is rigidly mounted to a lower arm 88 of the support bracket 84, extending outwardly therefrom and passing through a rubber grommet 90 secured within a frame plate 92, thus giving proper support to rod 20 when combined with the upward force exerted by the strikers 18 in their rest position. For greater stability for use with a single striker 18, the lower arm 88 can be provided with a spaced second pin engaging frame plate 92 in fashion similar to pin 86.

Operation of key mechanism 14 to induce sound energy within rod 20 will now be described in connection with FIG. 2. Depression of keybutton 26 causes keylever 28 to pivot counterclockwise. The ear 57 at the rearward tip of arm 16 of bellcrank 52 then engages the free end 72 of resilient striker 18 which it overlies and deflects it from the first or rest position shown in solid lines. When keylever 28 comes to the position shown in dotted lines, the free end 72 slips out of engagement with ear 57. Deflection of striker 18 as compared with the travel of keylever 26 is, of course, such that release occurs prior to abutment of keylever 28's arm 48 against downstop 50. Upon disengagement from ear 57, resilient striker 18 springs back to its first position (solid lines) where it strikes rod 20. Restoration of keylever 28 is accomplished under the urging of leaf spring 40. As keylever 28 is restored, the top surface of ear 57 of arm 16 engages the free end 72 of striker 18 (now stationary against rod 20 as shown in the solid line position in FIG. 2). Bellcrank 52 is yieldably mounted on extension 36, rotating clockwise on pivot 54 to allow keylever 28 to bypass free end 72. Subsequently, spring 62 restores bellcrank 52 toward its initial location, return motion ceasing when form 60 abuts the edge 67 of extension 36. Meanwhile, having bypassed the end 72 of striker 18, keylever 28 comes to rest with arm 39 against the upstop 46 under the urging of leaf spring 40.

The sharp blow from striker 18 which rod 20 receives as a result of the above-described flicking action by arm 16, induces sound energy in the form of sound waves within rod 20. A distinct blow occurs, bounce being minimized because of the contact load between striker 18 and rod 20 when the former is at rest. Though slight, the sound generated within the rod 20 is of an intensity sufficient to be audible to the operator. This is a desirable characteristic of apparatus 10 since it provides the operator with an indication that depression of the selected key has initiated the encoding action.

As shown in FIG. 4, divergent sound waves 94A and 94B arise upon the striking of rod 20 and propagate to the left and the right, respectively, along the axis of rod 20 at a substantially constant velocity. The sound waves 94A and 94B each include a respective compression wave front 96A ad 96B, followed by a series of expansion/compression wave cycles. Since striker 18 is initially at approximately a right angle to rod 20 and is guided by a slot 76 of comb 75 throughout its motion, as explained above, it will be at approximately a right angle to rod 20 at impact. As mentioned earlier, if the blow is substantially orthogonal, the sound waves 94A, 94B are symmetrical and of approximately equal intensity at least in the first few cycles. Each sound wave 94A and 94B is a complex composite of multiple cycles when viewed over the entire duration of the sound wave. The first half-cycle of wave front 96A, 96B is the clearest and least distorted, however, and this portion alone is all that is actually necessary to sense for proper operation of the present invention, as will be seen. Because of the nature of acoustic waves, rod 20 will "ring" (i.e., reflected waves will be present) for a certain period of time after it is struck, but intensity will generally taper off as energy is dissipated, though interference phenomena, and vibratory interaction with striker 18 (which also rings) may have reinforcing or canceling effects at intervals as indicated in FIG. 8a. Such occurrences only affect the repetition rate of the inputs to the encoding apparatus 10 since they are of no concern in the initial alternations of the signal and circumvented by addition of circuitry to prevent input of new data while there is the possibility that the apparatus is still exhibiting effects of the preceding impact.

Referring now to FIG. 1 and also to FIG. 3 (for greater clarity), it is seen that the first transducer 22A is located at one end 98 (at right in the figures) of rod 20 and the second transducer 22B is located at the other end 100. Such transducers are electromechanical devices for converting sound energy in rod 20 into electrical energy transmitted along the previously mentioned lines 108A and 108B. For purposes of this application, the term sound energy is interpreted to include the characteristics of sound waves 84A and 94B (see FIG. 4). The transducers 22A, 22B are constructed from a durable material such as a piezoelectric crystalline substance (for example, lead zirconate or barium titanate) and are commercially available in a wide variety of sizes and shapes. One supplier of a satisfactory transducer for this application is the Ferroxcube Corporation of Saugerites, New York, publisher of a booklet entitled *Piezoelectric Ceramics* fully describing such a transducer. Transducers 22A, 22B are each preferably an "X" cut piezoelectric disc used in the 33 mode of operation, the first mode number identifying the direction of the displacement and the second mode number identifying the direction of the mechanical stress or strain. In particular, the numeral 3 refers to the Z direction of a right hand orthogonal crystallographic axial set X, Y, Z, as more fully described in the above-mentioned *Piezoelectric Ceramics* booklet. For later reference, it may be noted at this point that transducers 22A, 22B are high impedance devices.

Proper functioning of associated electrical circuitry in the preferred embodiments requires that the first compressions—that is, sound wave fronts 96A and 96B—each be transduced into a positive voltage excursion. Accordingly, each transducer 22A, 22B is a piezoelectric disc, metal plated on both sides for ease of making solder connections, and polarized as will be described shortly. Transducer 22A has one plated side 102 adjacent end 98 or rod 20, and affixed to it with a strong adhesive such as Eastman 910, a ground lead 104A being solder connected to side 102. The side 106 opposite to 102 is solder connected to the output line 108A. Transducer 22B is similarly plated on both sides, with one plated side 110 of transducer 22B adjacent end 100 of rod 20 and again affixed to it by adhesive. Side 110 has a ground lead 104B soldered to it. Opposite to side 110 is side 112 which has an output line 108B soldered to it. Transducers 22A, 22B are polarized such that their sides 102, 110 adjacent rod 20 are negative, while the respective opposite sides 106, 112 are positive. Polarization thus oriented is such that the electrical energy output on line 108A or 108B is a positive voltage when the related transducer is compressed.

Referring now to FIG. 4, striker 18 must be positioned along rod 20 such that contact point 78 is located at unequal distances from each of the transducers 22A, 22B, in order that a measurable difference may exist in the time of arrival of the sound wave 94A, 94B sensed by the respective transducer 22A, 22B. In the example of FIG. 4, the distance from contact point 78 to transducer 22B is clearly shorter than that from contact point 78 to transducer 22A (or it could be vice versa). It should be understood, therefore, that any combination of unequal distances from either transducer will satisfy the requirements for the specific embodiments of the present invention, discussed subsequently, the only change needed as the striker 18 approaches closer to the midpoint 114 of rod 20 being an increase in the resolution of the associated time measuring device in logic unit 24 because of decrease in elapsed time.

Upon arrival of sound wave 94B at transducer 22B (which is closer in FIG. 4), that sound wave is converted into a periodic electrical signal termed the "leading" signal, as previously indicated, which is fed along line 108B to the electrical circuitry of logic unit 24 (described subsequently), the wave front 96B in particular giving rise to an initial positive half-cycle of the electrical signal in view of the polarization of transducer 22B. Some time later, sound wave 94A arrives at transducer 22A and is similarly converted into a periodic electrical signal termed the "following" signal, which is fed along line 108A, the wave front 96A of sound wave 94A again giving rise to an initial positive half-cycle of the electrical signal in view of the polarization of transducer 22A. Because of the unequal distances traveled and the constant velocity of the sound waves, it is evident that a predetermined time interval exists between the first positive half-cycles of each of the two periodic electrical signals for a given location of impact along rod 20.

As a numerical example, in FIG. 4 the distance between transducers 22A, 22B may be postulated to be eight inches and to contact point 78 of striker 18 postulated to be located 2.1 inches from transducer 22A and 5.9 inches from transducer 22B. Further, let it be postulated that rod 20 is made of steel, in which sound travels with a velocity of approximately 0.2 inch (0.51 cm) per microsecond. Accordingly, 10.5 microseconds after any impact of rod 20 by striker 18 at the above-specified location, the wave front 96B of sound wave 94B which diverges leftwardly, is converted by transducer 22B into a leading electrical signal fed along line 108B. 29.5 microseconds after that same impact, the wave front 96A of sound wave 94A diverging rightwardly is converted into a following signal fed along line 108A. Thus, the time interval between the initial half-cycles of the leading and following signals is predetermined by the physical characteristics of the apparatus as 19 microseconds as long as there is no change in the position at which rod 20 is struck. Those skilled in the art will recognize that the time interval or elapsed time (T) between the two wave fronts generated by a given striker 18 (or 18a, of course) can be determined directly from the relation $T = 2 d/v$ where d is the distance from the striker to the midpoint 114 of the rod 20 and v is the velocity of sound along the axis of rod 20. Conversely, of course, the distance d can be computed if the time interval is known.

Refer next to FIG. 5, showing two embodiments of a multistriker encoding apparatus, each having a slightly different arrangement of the strikers 18 along rod 20. In a first embodiment (open circles), evenly-spaced strikers 18 are positioned symmetrically about the midpoint 114 of rod 20. In a second embodiment where solid dots represent the strikers 18a, there is an almost identical sequence of equally-spaced strikers 18a, the exception being that these are now positioned asymmetrically about the midpoint 114 of rod 20.

In the first embodiment of the present invention (open circles), the symmetry of the arrangement causes the elapsed time between the first half-cycle of each signal to be the same for two different locations of striker 18 (mirror images about the midpoint 114), the only difference being the side of midpoint 114 from which the rod 20 is struck. It then becomes necessary to distinguish between the two locations by arbitrarily adding an extra bit to one or the other of the sets of otherwise identical data (the left or Channel B half of keyboard 12 has been chosen herein to have a "1" bit in the highest order when it carries the leading signal) and then determining whether the leading signal originated from transducer 22A or from 22B. Circuitry (later described) for determining precedence as to the signals from transducers 22A, 22B is provided in this first embodiment. In the asymmetric arrangement of the second embodiment (solid dots for strikers 18a in FIG. 5), each striker 18a upon impacting rod 20 produces diverging sound waves therein which yield a unique time interval between the leading and following output signals since no other striker 18a is at the same relative location. As is evident from FIG. 5, for a given spacing between strikers 18, the use of that same spacing in the asymmetric arrangement of the strikers 18a of the second embodiment requires that one of the strikers 18a be closer to the midpoint (or "center-line") 114 of rod 20 than either of the innermost two strikers 18' located next to midpoint 114 in the symmetric arrangement of the first embodiment. As a result, though the time intervals between signals are totally unique in the second case, the resolution requirements for the time measuring device increase because the magnitude of the shortest time interval is decreased, as previously mentioned.

It will be recalled that the primary purpose of logic unit 24 is to measure the elapsed time between the leading and following signals and then provide a code indicative thereof. Another function of logic unit 24 is to determine whether the input signals are valid and, if not, to eliminate the erroneous signal inputs so as to provide a code output only for signals originated by depression of a keybutton 26. For the first embodiment of the present invention—that is, the one with symmetric arrangement of the strikers 18—still another function is to determine whether the leading signal was sensed by transducer 22A or by transducer 22B, i.e., whether it appeared on Channel A or Channel B, and generate an extra bit to distinguish between otherwise identical codes. Furthermore, since the encoding apparatus must accommodate a succession of characters, logic unit 24 must be cyclical in operation. Therefore, upon arrival of the leading signal, the unit must be "activated" or put in an "ON" condition and must remain in the "ON" condition until after the last signal has ended, to indicate a "bust" state. It should be understood as to activation of the logic unit 24, that the following signal may arrive and, because of the physical characteristics, in fact almost always arrives at logic unit 24 during the occurrence of the leading signal. It should also be pointed out that because the duration of the following signal can be less than that of the leading signal, the following signal may not always be the last to disappear. Therefore, the cycle in logic unit 24 may terminate with the disappearance of either the leading or the following signal depending upon the duration of each. The disappearance may only be a temporary fading, as there may well be a recurrence of the signals as shown in FIG. 8a. In the preferred embodiments, a delay has therefore been provided in the logic circuitry such that when the longer lasting of the two signals has ended, a fixed period of quiescence will ensue before logic unit 24 is returned to an "Off" condition in preparation for receiving additional inputs.

Electronic circuitry for measuring the elapsed time between the leading and following signals to generate a code indicative thereof and for providing the other functions mentioned above is shown in block form in FIGS. 1 and 6 and schematically in FIG. 7, with timing diagrams being given in FIGS. 8a to 8o. The structure shown is only one example of many which satisfy the requirements of each embodiment of the present invention. This structure will next be described in reference to the just-mentioned figures.

FIG. 8a illustrates the characteristics of the transduced signals presented at the outputs 108A and 108B of transducers 22A and 22B. These signals are not always consistent in intensity, because of the high impedance nature of transducers in general. The amplitude of the signal voltage depends on a number of factors which include the force with which rod 20 is struck, the distance the sound waves 94A and 94B must travel and the material used for rod 20. In the embodiments of the present invention, a typical signal on the first positive excursion peaks at a minimum of 0.25 volt. The duration of the signals is typically of the order of two milliseconds, but can be greater than that when the previously-mentioned ringing within the system is taken into consideration. This duration of the signals is quite large relative to the time difference (roughly 64 microseconds at maximum for the embodiment disclosed herein) in arrival of the wave fronts 96A, 96B. It is thus evident that the characteristics of the signals at outputs 108A, 108B (FIG. 8a) may not always be conducive to proper functioning of the logic unit 24. The signals must be such that when entering the logic unit 24, each signal lies within a discrete range of voltage values of a desired polarity for compatibility with the electronic elements. Accordingly, the signal conditioning circuitry 116A, 116B has been introduced in the Channel A and Channel B paths, respectively.

In general, the signal conditioning circuitry 116A of Channel A includes a comparator 115A provided with a reference voltage as one input and an RC circuit as a second input. The RC circuit shifts the level of the transducer output signals and filters out possible low frequency signals from drive units such as the stepping motors now coming into such frequent use in print-out devices. Signal diodes to limit voltage excursions may also be included at the second input, if necessary, but may otherwise be omitted. The output of comparator 115A in circuitry 116A connects directly to logic unit 24 via a line 118A as shown in FIGS. 1 and 7. The signal conditioning circuitry 116B of Channel B contains identical elements and is similarly connected via a line 118B.

Consider next, the details of modification of the output signals 94A, 94B, from transducers 22A, 22B (typical signals for each stage being shown in FIGS. 4 and 8a, 8b) in reference to the section of the circuits shown at the left in FIG. 7, and generally identified by the heading "116A, 116B" and corresponding to the signal conditioning circuitry for Channels A and B. As shown in FIG. 7, the positive output side of transducer 22A—that is, lead 108A—is connected to the junction 117A of a pair of series-connected, voltage-dividing resistors 120A, 121A via an isolation capacitor 122A (capacitance 250 picofarads). The resistors 120A, 121A are high precision devices (1%) of equal magnitude (100K ohms, say) placed between a source of voltage V and ground. Because of requirements of the preferred TTL (transistor-transistor logic) integrated circuits used in logic unit 24, the voltage of source V is preferably +5 volts D.C. Accordingly the voltage at junction 117A is substantially 2.5 volts. The high precision resistors are necessary in order to ensure that differences in attenuation of the sound waves and resultant decrease in the amplitude of the alternating output signals on line 108A will not be compounded by differences in the voltage offset or bias appllied to the output signals. In such cases, equal voltage for the modified signals might be attained at significantly different portions of the wavefronts, thus introducing undesired timing errors.

The junction 117A is connected by a lead 123A as an input to the "plus" terminal of comparator 115A, while the "minus" terminal is connected by leads 124, 124a to a source of reference voltage, namely the junction 126 of series-connected, voltage-dividing resistors 127, 128, likewise placed between the voltage source, V, and ground. Resistors 127, 128 are also high-precision (1%) resistors, but are not equal in value, the former being about 10% lower than the latter (90.9K ohms vs 10K ohms, respectively, say) such that the voltage at junction 126 is approximately 5% higher than the quiescent voltage of junction 117A. The D.C. reference voltage at junction 126 may be further stabilized by addition of a filter capacitor 129 (capacitance 0.1 microfarad, say). When the audible frequency alternating electrical signal is generated by transducer 22A in response to sensing sound wave 94A, that signal is superposed on the D.C. level existing at junction 117A and because of the comparator 115A only positive cycles having an excursion greater than 0.1 volt cause a positive pulse to appear at line 118A.

As comparators 115A, 115B, one may use readily available commercial integrated circuit devices, such as the dual high speed comparator package supplied by National Semiconductor Corp. of Sunnyvale, California and identified by the number LM 319. The LM 319 serves the purpose exceedingly well because it has two comparators in a single package and an uncommitted collector in each output stage allows it to be readily made compatible with TTL circuit components by the addition of a pull up resistor (500 ohms, say) 129A connected between the output line 118A (from comparator 115A) and the 5 volt supply source V. The adjacent capacitor 130 located between the supply source V and ground is the usual by-pass unit added to protect the package from sudden surges in supply voltage.

The line 118A completes Channel A by connecting the output of comparator 115A with the logic unit 24 as previously stated (see FIG. 1 or FIG. 7). The output of comparator 115A when supplied with alternating signals similar to those shown in FIG. 8a is therefore a series of unipolar (positive) pulses, the leading edge of the first of the pulses being synchronous with the wave front 96A and having a peak value compatible with the components of logic unit 24. Identical conditioning circuitry 116B for Channel B has its components identified by the same numbers except that they bear the suffix "B" in place of "A". Being identical they will therefore not be described further herein. Typical output signals issuing from comparator 115A (and its counterpart 115B) are shown in FIG. 8b.

Before considering the individual elements of logic unit 24 in detail, a broad overview of these will be given in reference to the block diagram of FIG. 6. As seen in that figure, the modified signals appearing on lines 118A, 118B are supplied to the Channel latches 137 where they cause the setting of a related latch, the pulsating input signals thus being converted to logic levels. Simultaneously, through lines 119A, 119B tapped from lines 118A, 118B and connecting to a Cycle Time Out unit 136, the signals inhibit operation of this unit 136 until a later time. The logic levels from the Channel Latches 137 appear on a respective one of the output lines 141A, 141B, the first to appear (either line) initiating a cycle of the logic unit 24 by activating a Cycle Time Control unit 144, causing it to emit signals on its output lines 145 and 148. Line 145 is connected to a Counter 147 which begins counting when it receives the signal on line 145. Counting occurs at a rate determined by pulses on a line 133, the pulses being obtained from a free running source 134 of clock pulses. Line 148 from Cycle Time Control Unit 144 leads, on the other hand, to a Window Generator 153, the appearance of a signal on line 148 resulting in the emission of a slightly delayed signal of predetermined duration on line 154 at the output of Window Generator 153, the delay being sufficient to exclude the effects of shocks or electrical interference which might give rise to substantially simultaneous signals. On the other hand the duration of this signal is sufficient to encompass time intervals corresponding to actuation of a striker 18 which is furthest from one of the transducers 22A, 22B, or, expressed another way, furthest from midpoint 114 of rod 20. Signals with a greater time separation are excluded, however.

Line 154 proceeds to Coincidence Circuitry 155 and to the "Most Significant Bit" Latch 146 (referred to hereinafter as "MSB" Latch 146 for convenience). When a signal appears on line 154, it enables the Coincidence Circuitry 155 and clocks Latch 146, the output being dependent on the input, as will be seen. The significance of these two events is that, in the first instance, only signals on lines 118A and 118B which have a time separation consistent with that for depression of a keybutton can cause generation of a code. In the second instance, only if the leading signal is on Channel B can Latch 146 be set to indicate that a "one" bit should be included in the most significant position of the code generated. As seen in FIG. 6, the Coincidence Circuitry 155 responds to signals on lines 142A, 142B tapped into the output lines 141A, 141B from the Channel latches 137 and when both are latched, i.e. defining the elapsed time up to appearance of signals on both channels. A level appears on line 156 to transfer the status of counter 147 at that instant into the Output Control 158 via counter output lines 149. The status of the Most Significant Bit latch 146 is also determined at the same time, that information being likewise transferred into Output Control 158 via the output line 150 from latch 146. Transfer of information into the Output Control 158 is accompanied by setting of a flag in 158 to alert utilization device 151 of the availability of data or "Data Good" by issuance of a signal on line 184 from Output Control 158. The binary code output corresponding to the elapsed time is stored in Output Control 158 until called for by the Utilization Device 151 by a "Read-Out" signal sent to Output Control 158 via a control line 185 connected to Output Control 158. After latching of the elapsed time code, Counter 147 continues to count without further effect until it reaches a predetermined value sufficient to allow for the full range of normal elapsed times for the given acoustic encoding apparatus. At that instant, it provides a signal on line 159 to serve two purposes: first, to trigger generation of a delay prolonging the cycle (as a margin of safety), by Cycle Time-Out Generator 136 (with no effect so long as there is still a signal on either lines 119A or 119B inhibiting its action), second— and more important at this point—the purpose of the signal on line 159 is to reset the Window Generator 153. Such resetting removes the enabling signal on line 154 leading to the Coincidence Circuitry 155, blocking any possibility of later emitting a signal on output line 156 to cause transfer of a spurious binary value into the storage part of Port 158. Thus, only signals on lines 118A and 118B which have a maximum time separation consistent with that for location of the striker 18 furthest from midpoint 114 of rod 20 can cause generation of a code. Line 154 also leads to the MSB latch 146, but resetting of Window Generator 153 has no real significance with respect to that unit, since transfer of the output from latch 146 this latch in the cycle is not possible in view of the just-mentioned disabling of the Coincidence Circuitry 155. Thereafter, Counter 147 counts on as before, periodically reaching the abovementioned predetermined value and giving another signal on line 159 to again trigger the Cycle Time-Out Generator 136, and again with no effect if a pulse originating from rod 20 is still present on either line 119A or 119B. Finally, when pulses have disappeared from both these lines, the triggering signal on line 159 takes effect. After a predetermined minimum time delay subsequent to signal disappearance, a signal is emitted by Cycle Time-Out Generator 136 on output line 160 connected to Reset Generator 162. The signal on line 160 triggers the Reset Generator 162, causing it to issue a "clear" pulse on its output line 164 connected as a resetting input to the Channel Latches 137 and the MSB latch 146. This pulse marks the end of the cycle. The duration of the "clear" or "Reset" pulse on line 164 is determined by the appearance of the next clock pulse on line 133A tapped to line 133 and connected as a reset input to Reset Generator 162. It may be noted that Output Control 158 is cleared of its contents not by the above-described "Reset" pulse, but by another control signal from the Utilization Device 151 transmitted along the interconnection 185.

Having given a broad view of the various elements of logic unit 24, a detailed description will now be given in reference to FIG. 7 and the timing diagrams of FIGS. 8a–8o. As drawn, the schematic of FIG. 7 is strictly applicable only to the first embodiment of the encoding apparatus of the invention, i.e. one with a multiplicity of equally spaced strikers 18 disposed symmetrically (mirror image) about the mid-point 114 of rod 20. FIG. 7 is actuated applicable also to the second embodiment— that with the equally-spaced strikers 18 disposed asymmetrically or "offset" with respect to the midpoint 114 of rod 20—upon mere removal of the MSB latch 146 and provision of a double frequency clock souce 134, recognizing that the time scale would be half that shown in FIGS. 8i and 8k, so the count would not stop at 31, but go on to 64; and that the codes for most of the keys would be different. Because of the slightly more complex structure of the symmetrical approach, that one will be described, the other being substantially identical except for the above-mentioned changes which would not alter the overall description in major respect, the basic principle being unchanged.

The circuitry of logic unit 24, herein described, includes many well-known TTL (transistor-transistor logic) integrated circuit components which are commercially available from a number of sources, the sources of the preferred units being named in each instance. Other types of circuitry components having the same capabilities and limitations could be used. As previously described in reference to FIG. 6, Logic Unit 24 includes Channel latches 137 for storing information as to the arrival of signals on lines 118A, 118B; a Cycle Time Control 144; a Counter 147; a Source of clock pulses 134; a Window Generator 153; a Coincidence Circuit 155; a Time Out Generator 136; a Reset Generator 162 and—for the first embodiment only—a "Most Significant Bit" (MSB) latch 146. Unused inputs of the components may be assumed to be connected to appropriate voltage levels, in well-known fashion.

The Channel latches 137 comprise a pair of identical "set/reset" latches 138A, 138B. These latches being identical, only the first (138A) will be described. Latch 138A consists of a two-input OR-gate 139A and a two-input AND-gate 140A with the output (−3, the dash indicating it is a suffix to the gate number omitted for brevity) of each gate cross-connected with an input of the other gate by lines 166A, 167A in a known fashion to form a memory device. Output line 118A of Channel A forms the other input (−2) of OR-gate 139A. Accordingly, when a signal appears on Channel A—that is, appears on line 118A—the first positive pulse of the signal will pass through OR-gate 139A and because of the cross connection 166A it will be supplied, as above indicated, to one input (−2) of AND-gate 140A. The other input (−1) of gate 140 is connected to a line 164b and is normally enabled since there is a high level on line 164b, it being connected to the Q output of the reset generator flip-flop 163 via the tapped connections to lines 164 and 164a. The Q output of flip-flop 163 is normally high, since the reset generator 162 is activated (flip-flop 163 put into its set state where Q is low) only at the end of the cycle, as will be seen. Thus, immediately upon appearance of a signal on line 118A at the first-mentioned (−1) input to OR-gate 139A, the cross-connection 166A between the output of OR-gate 139A and the enbled AND-gate 140A results in the passage of that signal through AND-gate 140A with a slight delay. Then, via the cross connection 167A to the other input (−2) of OR-gate 139A, the delayed signal passes through the OR-gate 139A to repeat the circulation and establish a continuous output on line 141A regardless of the pulsating nature of the signal on line 118A. This "latching" of the output of OR-gate 139A to a constant high state indicates that logic 24 is "ON"—that a cycle has begun—and is shown in FIG. 8c. The Channel Latches 137 may be implemented by appropriate interconnection of AND-gates and OR-gates from the sets of four in the respective integrated circuit packages of the 74 series manufactured by Texas Instruments Inc., Dallas, Texas, and identified as 7408 and 7432.

The output (−3) of OR-gate 139A goes to the Cycle Time Control 144 via line 141A and to the Coincidence Circuitry 155 via line 142A tapped to line 141A. As seen in FIG. 7, line 142A is, however, just one input (−1) to a two-input AND-gate 160A having its output (−3) connected to the clock input C of a flip-flop 170 via line 171. At this time, assuming that the signal on Channel A is the leading signal, no signal should be present on the other input (−2) of gate 168 which is connected to a similar line 142B from Channel B. In such case, there is no effect on the Coincidence Circuitry 155. As to the Cycle Time Control 144, it is seen to contain a two-input OR-gate 172 having line 141A as one input (−1). Accordingly, when the output (−3) from latch 138A goes high, that level passes through OR-gate 172 and appears on a line 173 between the output (−3) of OR-gate 172 and an inverter 174 connected in turn to the output line 145 of Cycle Time Control 144. Line 173 is also connected to the Window Generator 153, discussed next, by a line 148.

As previously mentioned, the function of the "windows" generated by circuit 153 is to determine whether a "following" signal appearing at logic unit 24 is valid—that is, "following" signals which are too early or too late in terms of the window are invalid and must be prevented from erroneously generating a code output. The Window Circuit 153 comprises a flip-flop (or "latch") 157. All flip-flops shown herein are TTL circuits of the D type which have preset, data and clear (or "reset") inputs, while the outputs Q and Q̄ (the latter inversely of course) reflect the status of the Data input D upon triggering of the clock input C by the positive-going edge of a pulse or a change to a high level. With one exception discussed subsequently, the preset is not used. Referring still again to FIG. 7, it is seen that the line 148 tapped to the line 173 at the output (−3) or OR-gate 172 is connected to the input C of flip-flop 157. Accordingly, when the first positive pulse of the leading signal appears on line 118A (or line 119A, as the case may be) and passed through OR-gates 139A and 172, the positive-going edge of the resultant step to a high level at the output (−3) of OR-gate 172 causes triggering of the clock input of flip-flop 157 via line 148, the status of the input D then being transferred to the output Q of that flip-flop. As seen in FIG. 7, the input D of flip-flop 157 is clampd at a high level by being connected to the source of voltage V. Accordingly, whenever its clock input C is triggered, flip-flop 157 will be "set" and the level at the output Q will go high. This high level, which appears subsequent to the cycle initiation time because of several gate delays as shown in FIG. 8d, is presented via lead 154 to the input D of flip-flop 170 and to the clock input C of MSB latch 146 discussed subsequently.

Returning now to consideration of the high level through OR-gate 172 to inverter 174 and line 145, the effect of the change of state on line 141A is that the level on line 145, previously high because of the inversion of the low on line 173, conversely now goes from high to low. Line 145—it will be recalled—is connected to the Counter 147. This counter is an 8 stage binary counter of which the first two stages are used for purposes of resolution. Counter 147 is preferably implemented with a dual 4-bit binary counter, an integrated circuit package of the 74 series identified as SN 74393 and manufactured by Texas Instruments Inc., Dallas, Texas. This integrated circuit uses positive logic and has individual clear inputs for each of the 4-bit binary counters together with individual clock inputs triggering when the clock pulse goes low. As seen in FIG. 7, line 145 is connected to pins 147-2 and 147-12 (dash numbers being the above-named manufacturer's pin numbers) which are the "clear" inputs in the SN 74393 package. Accordingly, when the level on line 145 goes low at the time when latch 138A is set, clamping of the Counter 147 to zero output is released. As a result, the clock pulses on line 133 from the clock source 134 (implemented as a well-known free running crystal oscillator having a square wave output at a 2.0 megaherz frequency) take effect in view of the connection of line 133 to pin 147-1, the clock input to the low order 4-bit counter in the SN 74393 package. The size of the counter and the clock rate are interrelated and are determined, in the embodiments disclosed herein, by the fact that the encoding apparatus 10 is intended for use with a typewriter keyboard 12 having at least 56 keys 26 in staggered rows and operating strikers 18 spaced about 0.2 inch (0.51 cm) apart. Consequently, the innermost strikers 18 of the symmetrical embodiments are located at 0.1 inch (0.25 cm) to each side of midpoint 114. In an asymmetric arrangement, with the same spacing between strikers 18a, the closest to the midpoint 114 would be located at half that distance from it—namely, 0.05 inch (0.13 cm). Based on information given earlier, for the steel rod of the embodiments, the 0.2 inch spacing corresponds to elapsed times separated by 2 microseconds, the shortest elapsed time—i.e. the earliest arrival time for the following signal being at 1 microsecond for the symmetrical embodiment and at ½ microsecond for the asymmetric arrangement. For proper resolution, the clock period should be at least half the shortest elapsed time, or ½ microsecond for the symmetrical embodiment and ¼ microsecond for the asymmetric embodiment. Accordingly, the frequency of the clock pulses should be 2.0 Megaherz for the symmetric embodiment as shown in FIGS. 7 and 8h, 8i. It should be noted that the values given for spacing, frequency, sound velocity, etc. are rounded numbers for simplifying the discussion and thus differing somewhat from the values to be used in actual design. It may be noted from FIGS. 5 and 8j that the spacing of the strikers 18 in relation to the counting activity of counter 147—including the preliminary stages not shown—is such that the transitions of the counts appearing on the latter are offset from the arrival times of the following signals to avoid potential race conditions here.

As mentioned above and as is more evident from the timing diagram, FIGS. 8h–8i, it is only at the time of the fourth pulse from clock source 134 that there will be appearance of an output on the least significant bit output line 149-1, which is connected to pin 147-5, actually the third stage of the low order binary counter. Further, the output of the fourth stage of that internal counter is used as the clock source for the high order binary counter, as evidenced by connection of the pin 147-6 to pin 147-13 via line 175, the last mentioned pin of the SN 74393 package being the clock input to the four higher orders of the combined 8 bit counter. Accordingly, the counter will change state every two microseconds as shown in FIG. 8i, there being appropriate changes on the output lines 149-1, 149-2, . . . 149-16, the dashed suffixes indicating the binary weight of the particular data line 149. The bits of information on the lines are continuously available to the Output Control 158 for capture, though intermittently varying as the counter operation progresses.

In the meantime, the following signal should arrive on the other channel—that is, on line 118B if the leading signal appeared on line 118A, and vice versa. For purposes of the present discussion, which began with the appearance of a signal on line 118A, then the following signal must appear on line 118B, the first positive pulse thereof setting the latch 138A and thus causing the presence of a high level on line 141B and also on line 142B tapped therefrom. This high level too passes through OR-gate 172 of the Cycle Timer Control 144, but produces no change as it merely duplicates the conditions established earlier on line 141A at the other input (−1) of OR-gate 172. Presence of the high level on line 142B, however, causes a corresponding high level output on line 171 of previously-mentioned AND-gate 168 of Coincidence Circuit 155, because there is now a high level on both inputs (−1 and −2) of that AND-gate. The appearance of a high level on line 171 clocks flip-flop 170 of Coincidence Circuit 155 and transfers the state of the D input thereof to its output (−3). It will be recalled that the leading signal set the output of Window Generator 153 to a high level such that via line 154 the D input of flip flop 170 is high, then the high level appearing on line 171 (which interconnects the output of AND gate 168 with the clock or C input of flip flop 170) upon arrival of the first positive pulse of the following signal, causes the immediate setting of flip flop 170. As a result, the level on the Q output of flip flop 170 which is connected to a line 156, goes low. Line 156 serves as one input (−2) of a two-input AND-gate 178, which forms part of the Output Control 158.

AND-gate 178 is connected to a strobe input of a 6-bit data latch or preferably an Input/Output Port 180. This last is preferably implemented by the integrated circuit package identified by model number 8212 and manufactured by the Intel Corp. of Santa Clara, Calif. which is an 8-bit latch with tri-state output buffers along with control and device selection logic as well as a service request flip-flop for the generation and control of interrupts to the utilization device 151. AND-gate 178 has its output connected via a line 182 to pin 180-11 of the Input/Output Port 180. Pin 180-11 is the strobe input of the Input/Output Port 180. The known operation of this Input/Output Port 180 is such that placing a low level on the pin 180-11 clocks the information on the input lines 149-1 to 149-16 into internal data latches (not shown in FIG. 7), thus capturing the value then existing in Counter 147. The output of the MSB (most significant bit) latch 146 of the first embodiment is also captured at the same time. The internally latched data are not available on lines 25-1 to 25-32 at this time because of the high impedance state of the buffers. Latching of the information is accompanied by the setting of the above-mentioned service request flip-flop (not shown in FIG. 7) as a flag to indicate that data are now available. An inverted signal from the output of that flip-flop on line 184 is sent to the utilization device 151 as an indication that data are available or "good". Then, when the utilization device is ready for the data, it sends a readout instruction via a line 185 which selects the Input/Output Port 180 for transfer of the information from its internal latches to the six buss lines 25-1 to 25-32, the signal on line 185 gating internal buffers of the Input/Output Port 180 to a high or a low as required (the buffers also not being shown in FIG. 7). The readout instruction also clears the flag in the service request flip-flop (again not shown). It may be noted that the lines 184, 185 form part of the inter-communication path between Utilization Device 151 and Output Control 158, as was shown in FIG. 6.

An interactive communication path is not a necessary element of the invention because if the utilization device were a display unit, for instance, the data from lines 149-1 to 149-16 and line 150 would merely need to be latched and output directly to the display device from that instant on. That is to say, there would be no need for any buffering, nor for intercommunication of control information.

The time interval between the leading and following signals having been determined and the appropriate count transmitted either directly to the utilization device or to a storage unit to be held until requested by the utilization device, the basic function of the encoding apparatus will have been achieved. It is however necessary to perform several other functions—namely, to determine the end of the cycle and to reset the various memory elements in preparation for reception of the next input signal. As mentioned earlier, the elapsed time varies considerably depending upon the location of the particular striker 18 actuated in response to depression of a related keybutton 26. Accordingly, the duration of the signal from Window Generator 153 must be such as to accomodate time intervals corresponding to strikers 18 which are at the greatest distance from the midpoint 114 of rod 20. In the embodiment shown, the maximum elapsed time as seen from FIG. 8k is somewhat less than 64 microseconds allowing for tolerance in the system. Accordingly when the signal appears on pin 147-8 of the 8-bit binary counter 147 (an output on this pin having true binary weight of 128) it occurs 64 microseconds after the start of counting by Counter 147 remembering that the clock rate is 2 megaherz (0.5 microsecond period). Then via lines 159, 159A it proceeds to the Window Generator 153. There, line 159A connects through an inverter 186 to the reset input of flip-flop 157, forming part of the Window Generator 153. The reset input of this flip-flop becomes active upon a low input as stated previously and as indicated by the small circle implying inversion, in customary fashion for the 7474 type of flip-flop. Accordingly, the presence of a high level on line 159A causes a low level at the output of inverter 186, which resets flip-flop 157 via line 187. The resetting of flip-flop 157 puts a low level on its output Q and therefore via lines 154 and 154a to the clock input C of flip-flop 146 and the data input D of flip-flop 170. There is no effect with respect to flip-flop 146 because the clock action is not sensitive to a negative-going signal i.e. the return from a high level to a low level does nothing. As to the flip-flop 170, however, closing of the window from generator 153 means that if that flip-flop were now clocked, the low level on line 154A connected to the input D would transfer a zero to the Q output (not shown) and conversely place the output Q at a "1", causing it to remain at a high level. Thus it would no longer be possible to pass a signal via line 156, gate 178 and line 182 to the strobe input (−11) of the Input/Output Port 180. In other words, any signal on line 171 indicating that there was now a high level on both inputs to AND-gate 168 could not cause the latching of the current counter output on lines 149-1 to 149-16 and line 150 in the Input/Output Port 180, the coincidence of the signals having come too late to be a valid, key-originated signal. The closing of the window does nothing else to the system, Counter 147 continuing to respond to the clock pulses on line 133. It should be noted, however, that the output on line 147-8 which was applied to lines 159 and 159A also went via line 159 to a counter 190, hereinafter referred to as the "Time-Out Counter", which is part of the Time-Out Generator 136. Counter 190 is an 8-bit binary counter identical to Counter 147, i.e. preferably an integrated circuit device equivalent to SN 74393. Line 159 is connected to pin 190-1 which is the clock input to the low order 4-bit counter of the combined 8-bit unit. The clock will attempt to increase the count in Time-Out Counter 190 by one. However, it will be noted that the pins 190-2 and 190-12 (which are the reset inputs of counter 190) are connected via a line 191 to the output (−3) of a two-input OR-gate 192 which has the lines 119A and 119B connected to a respective one of the two inputs. As mentioned earlier, the two lines 119A and 119B are tapped to the Channel A and Channel B input lines 118A, 118B to logic unit 24. Accordingly, as long as there is a pulse on either of these lines, that pulse will pass through OR-gate 192 and via line 191 will put a clear signal on pins 190-2 and 190-12 (the reset inputs of Counter 190) and thus prevent any counting by Time-Out Counter 190. Eventually, however, as seen in FIGS. 8a and 8b there will no longer be any output from transducers 22A, 22B to give rise to pulses on line 118A or 118B with the result that the next time that counter 147 achieves an output on lines 147-8, that output will again be transmitted via line 159 to the clock input 159-1 with the result that Time-Out Counter 190 will then increase its count by 1. This output on line 147-8 will recur periodically as counter 147 continues its cycling. Eventually, clocking of signals into the Time-Out Counter 190 will cause an output to appear on its pin 190-10 corresponding to a binary 16. This differs from the weight assigned to that pin in Counter 147, because the substages of Time-Out Counter 190 are given full weight in calculating the value of the stage having its output at pin 190-10. The binary value of 16 for the signal appearing on line 160 corresponds to that many complete cyclings of Counter 147 after disappearance of the last pulse on either of the two lines 119A, 119B. Thus, the signal on line 160, which is the reset signal, as explained below, has been delayed about 2 milliseconds in view of the fact that each cycle of Counter 147 takes about 128 microseconds when clocked by a 2 Megaherz pulse train such as that from clock source 134. The 2 milliseconds of delay after disappearance of the last pulse on either the two lines 119A, 119B, is an arbitrary value and can be adjusted to suit the requirements of a particular system by connection of the line 160 to an output pin of Counter 190 having the necessary binary value (other output pins not shown, but identical to the pins shown for Counter 147).

Reset Generator 162 is provided to generate a "clear" pulse, shown in FIG. 8o, for ending the cycle of logic unit 24. The primary function of the clear pulse is to reset the channel latches 138A and 138B to put logic unit 24 in the ready condition for the next key depression. Reset Generator 162 comprises a D type flip-flop 163 of the kind previously described—namely, a 7474 manufactured by the Texas Instruments Company. The line 160 from the pin 190-11 of the Time-Out Counter 190 connects with the clock input C of flip-flop 163 which has an output Q feeding back via line 164 to the data input D of flip-flop 163. Because there is a normally high level on line 164, as previously mentioned in connection with the enabling of the Channel Latches 137, the step change in level on line 160 from low to high will trigger transfer of the high level present on the input D of flip-flop 163, causing the setting of this flip-flop which is accompanied by a change of the Q output to a low level as a negative-logic reset signal.

The duration of the reset signal is controlled by the clock source 134 inasmuch as line 133 has a line 133A tapped to it which connects through an inverter 132 to a line 135 leading to negative-logic reset input R of flip-flop 163. Accordingly, after the flip-flop 163 has been set by the signal on the line 160, it will be reset by the positive-going edge of the next clock pulse to appear on line 133A, the inverter 132 changing the reset logic from negative to positive as is evident. Because the Counter 147 is timed by a negative-going portion of the clock pulses on line 133 and there are propagation delays in rtransmitting the count information from Counter 147 to counter 190, the duration ot the output pulse is of the order of less than one-half of a clock period, i.e. less than one-quarter microsecond, but this has been found sufficient to assure effectiveness of the clear pulse fed along lines 164a and 164b to AND-gates 140A and 140B of the Channel latches 138A and 138B. The low level applied at inputs 140A-1 and 140B-1 of the AND-gates disables the AND-gates, interrupting the recirculating signals from the OR-gates 139A and 139B through the respective cross-connections 166A and 166B. The interruption places a low level on lines 141A and 141B, an indication that the Channel latches are reset and that the logic cycle of unit 24 is complete. The low level on lines 141A and 141B in turn puts a low level on line 173 at the output of OR-gate 172, this low level being changed by inverter 174 to a high level which resets Counter 147 through line 145 to pins 147-2 and 147-12. The clear pulse on line 164a resets the MSB latch 146 via its negative-logic reset input R. Time-Out Counter 190 is not reset at this time but maintains its count, it may be noted from FIG. 8n, until the appearance of the next signals on lines 119A and 119B which will pass through OR-gate 192 and, via line 191 to pins 190-2 amd 190-12, will then reset the Time-Out Counter 190 and continue to do so periodically, as previously described, as long as the signal trains are present. The Coincidence Circuit latch 170 is not reset by the clear pulse, but rather by the readout signal appearing on line 185 from the Utilization Device 151. The readout signal is a negative-logic signal fed to negative-logic reset input R of flip-flop 170 via line 185a which is tapped to line 185. The reason for this late resetting of flip-flop 170 is that premature resetting would remove the low level on line 156 at the input 178-2 to AND-gate 178 which caused the latching of the elapsed time data in the Input/Output Port 180 and thus might permit garbling of that information prior to receipt of the readout signal on line 185. Furthermore, because of this resetting action by the readout signal, a line 185b tapped to lien 185a is provided as a second input to AND-gate 178 such that during the presence of the readout signal on line 185, the output of AND-gate 178 on line 182 is held low even though flip-flop 170 has been reset and the signal on line 156 has gone high as a result of the low level on line 185A connected to the reset input R of flip-flop 170. The signal on readout line 185 will similarly reset the internal latch in the Input/Output Port 180 which has been transmitting a negative-logic "data good" (DG) signal on line 184 to the Utilization Device 151. Lastly, it will be seen that a negative-logic signal RS on line 188 is provided to the reset input R of the Input/Output Port 180 and to a present input P of flip-flop 163 via a line 188A tapped to line 188. These inputs along lines 188, 188a are used for initializing the system condition when power is turned on. After all the flip-flops have been reset, the apparatus 10 is ready for timing the next inputs received along channels A and B.

The MSB latch 146 provides a data bit for the final data to distinguish whether the leading signal arrived on channel A or channel B. Referring to FIG. 4, strikers 18 are positioned symmetrically about the midpoint 114 of rod 20 and are equally spaced. Therefore, the two signal trains generated by a striker 18 positioned on one side of midpoint 114 will have the same elapsed time interval between their first positive half-cycles as will the two signal trains generated by the striker 18 at an equal distance from midpoint 114, but located on the opposite side. It becomes necessary in the first embodiment to assign the sixth binary bit arbitrarily to one side or the other of the keyboard 12. For purposes of this disclosure, as mentioned previously, the left side or Channel B has been chosen. It is now necessary to determine whether the leading signal originated on the right or the left side of the rod 20. Referring to FIG. 7, it is seen that MSB latch 146 is a D type flip-flop with a data input D, a clock input C, a negative-logic reset input R and an output Q. Flip-flop 146 is a TTL circuit of the D type which triggers on the positive-going edge of the clock pulse to transfer the data from input D to the output Q. Because of a potential race condition, the unit suitable here is a higher speed version of the flip-flop previously described, manufactured by Texas Instruments and identified as a Model 74H74, the first digit pair indicating that the device is also a member of the 74 series and the letter H indicating that it is a High-speed unit. The response time for this flip-flop is only 15 nanoseconds as compared to the 20 Nanoseconds of response time for the units suitable for the other latches. The higher speed unit is necessary for a reason which will become evident. The data input D of flip-flop 146 is connected to the output line 141B from the Channel B latch 148B through a line 143B tapped to line 141B. The clock input C of flip-flop 146 is tied to the line 154 connecting with the output Q of the Window Generator flip-flop 157. The output Q is initially at a low level, but goes high when active, i.e. when flip-flop 157 is "set". The setting occurs whenever an input from either channel A or channel B has initiated a cycle of the logic unit and therefore the Window Generator flip-flop 157 has been set through line 148 from OR-gate 172, as previously described. The change to a high level on line 154 connected to the clock input C of flip-flop 146 triggers the transfer of the status of its data input D to output Q. As seen in FIG. 8d, the window signal 154 goes high a little bit later than the original signal on line 141B shown in FIG. 8c because of gate delays. Even so, because the same signal gives rise to both the data input and the clock input to flip-flop 146, even with the gate delays the response of the data input is marginal when the circumstances favor the high end of the tolerance range. Accordingly, it is desirable to use a faster device for flip-flop 146 than is used for flip-flop 157. If then, the leading signal appears along channel B, it sets the latch 138B, placing a high level on line 141B. That high level passes through OR-gate 172 and line 148 to set flip-flop 157 and, in view of the fast response, assuredly places a high level on the data input D of flip-flop 146 via line 143B such that the setting of flip-flop 157 clocks a high level to the output Q of flip-flop 146 and to the Input-Output Port 180 via line 150. There it is latched when the subsequent arrival of the signal on line 118A causes setting of the Coincidence Circuit flip-flop 170, with resultant transfer of the counter outputs on lines 149-1 to 149-16 and the value on line 150 to the data latches of Input/Output Port 180. A high level on line 150 indicates that the leading signal appeared on channel B—that is, the striker 18 triggered from keyboard 12 was one situated to the left of the midpoint 114 of rod 20. Conversely, if the leading signal is on channel A, the low level on the data input D of flip-flop 146 when line 154 goes high to clock the transfer of the D input status, places a low level on the output Q but this does not signify a change since flip-flop 146 is initially in the reset state. The output Q of flip-flop 146 then remains at a low level as shown in FIG. 8f to indicate that the leading signal was along channel A and that the sixth bit should be a zero, the count thus being 31 or less.

The foregoing description of an encoding apparatus comprises a rod 20, one or more strikers 18 (or 18a) arranged symmetrically (or asymmetrically) about the midpoint 114 of rod 20, piezoelectric transducers 22A, 22B affixed to respective ends 98, 100 of rod 20 and effective to convert into electrical signals any sound waves propogated in rod 20 upon impact by striker 18 (or 18a). The electrical signals are separated into a leading and a following signal and fed to a logic unit 24 which includes a binary Counter 147 driven by a free-running clock source 134. The leading signal starts Counter 147, the counter output appearing in binary code form on five (or six) lines 149-1 to 149-16 (or 149-32 in the asymmetric case), and the output on a further line 150 supplying a higher order bit of binary weight 32 (as required in the symmetric case). The code on these lines is transferred into the temporary storage of an Output Control 158 upon arrival of the following signals. The stored code in Output Control 158 may be supplied to a Utilization Device 151 immediately or upon demand. The strikers 18 may be operatively connected to the key mechanisms 14 of a keyboard 12.

The present invention may be embodied in other specific forms without departing from the spirit or essential characteristics thereof. In particular, as will be evident to those skilled in the art, the single striker shown in FIG. 4 could be movable to any of the positions shown in FIG. 5 (either embodiment) and actuated there to achieve the desired code output. Likewise, the one overall "window" signal of FIG. 8d could be replaced with a series of short windows, each encompassing a predetermined elapsed time. Furthermore, while FIG. 4 implies the use of longitudinal waves, it will be clear to those skilled in the art that torsional waves, transverse (or shear) waves, surface waves, etc., solely or in combination could also be used. Moreover, it will also be clear that just one transducer 22 located at one end of the rod 20 and forming the leading and following signals by picking up direct and reflected waves could be used but would require a more sophisticated and expensive system. Also, while the bit added to distinguish between the two sets of identical codes for the symmetrical arrangement has been shown as a "most significant" bit, it will likewise be clear that the distinguishing information could be located in any order of the output including the least significant and could even comprise more than one bit, if desirable.

The presently disclosed embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An apparatus for generating a code representative of a mechanical motion comprising:
   a member for transmitting vibratory energy, said member having respective sides in relation to a midpoint of the member;
   means for inducing vibratory energy within said member in response to said mechanical motion, said inducing means being operable at a plurality of positions spaced along said respective sides of the member and at least a pair of said positions being in lateral symmetry about the midpoint, the vibratory energy forming separate wave fronts travelling in diverging directions;
   means operatively connected to said member for transducing said wave fronts into signals with an elapsed time therebetween, vibratory energy induced at symmetrical positions giving rise to identical elapsed times; and
   means connected to said transducing means to generate from said elapsed times a discrete output representative of occurrence of the mechanical motion at each of said positions, said output generating means including discriminating means responsive to signals from positions on a particular one of said respective sides and effective to provide a different output for each position of a symmetric pair.

2. The apparatus as defined in claim 1 wherein said signals are a leading signal transduced from a first arriving wave front and a following signal transduced from a second arriving wave front.

3. The apparatus as defined in claim 2 wherein said member is an elongated member.

4. The apparatus as defined in claim 3 wherein said elongated member is a cylindrical rod.

5. The apparatus as defined in claim 4 wherein said cylindrical rod is made of metal.

6. The apparatus as defined in claim 3 further including a pair of transducers equally spaced from said midpoint.

7. The apparatus as defined in claim 6 wherein said output is in code form and said transducers are at the ends of said elongated member and said means included in said output means are responsive to one of said pair of transducers and effective to provide different codes for said symmetrical positions with identical elapsed times.

8. The apparatus as defined in claim 1 wherein said transducing means includes a pair of transducers operatively connected to said member at unequal distances from said inducing means.

9. The apparatus as defined in claim 8 wherein said transducers are of a piezoelectric material.

10. The apparatus as defined in claim 1 wherein said means to generate an output includes an electronic timing device.

11. The apparatus of claim 10, wherein said electronic timing device comprises a counter with code-form output, a clock source for operating the counter at a predetermined rate, means initiating counting by the counter at the predetermined rate in response to a leading signal transduced from the first arriving wave front and means operatively connected to the counter and effective to capture the then existing code-form output of said counter in response to the following signal transduced from the second arriving wave front.

12. The apparatus as defined in claim 1 together with a depressible key, said mechanical motion arising upon a depression of the key and the said output being a code representative of said depression of the key.

13. The apparatus as defined in claim 3 wherein said inducing means includes a striker for impacting said elongated member.

14. The apparatus as defined in claim 13, wherein said striker impacting said elongated member produces an audible vibration within said member.

15. The apparatus as defined in claim 13, wherein said striker includes a resilient elongated wire rigidly supported at one end and having a free end striking said elongated member in response to deflection and release of said free end.

16. The apparatus as defined in claim 12 wherein said inducing means is a flexible steel spring mounted for movement from a relaxed first position to a flexed second position and return toward said first position for striking said elongated member in response to said key depression.

17. The apparatus as defined in claim 16 wherein said inducing means includes means for guiding said movement of the steel spring.

18. In a keyboard having at least two keybuttons, a device for providing a signal representative of the keybutton which is activated, which device comprises:
   a member for transmitting vibratory energy, said member having a midpoint;
   means activated by said keybuttons for imparting vibratory energy to said member at a different location for each keybutton, at least a pair of said locations being symmetrically disposed about said midpoint;
   means for detecting said transmitted energy at two spaced apart points and having the outputs thereof coupled to
   means for providing a signal representative of the difference in time of arrival of said transmitted vibratory energy at said detection means, said symmetrically-disposed pair of locations yielding identical differences in time of arrival, and means coupled to the detecting means at one of said two points and operable to modify said representative signal in response to detection of transmitted energy by the detecting means at said one point, whereby a unique signal is obtained for each keybutton activated.

19. An apparatus for a keyboard having at least two depressible keys, the apparatus operable to generate a unique code representative of each key, comprising:
an elongated member for transmitting acoustic energy, said elongated member having a midpoint defining first and second halves of the member;
a striker corresponding to each said key and spaced along said elongated member in symmetric pairs about said midpoint, each said striker being adapted to impact said member and induce acoustic energy therein in response to depression of the corresponding key and the induced acoustic energy forming separate wave fronts travelling in diverging directions;
means operatively connected to said elongated member for transducing said wave fronts into a leading and following signal with an elapsed time therebetween, each symmetric pair producing equal elapsed times; and
means connected to said transducing means to generate therefrom said unique code representative of each key, said code generating means including discriminating means providing a different code in response to production of said leading signal by strikers along said first of the halves of the member.

20. The apparatus as defined in claim 19 wherein said transducing means includes a pair of transducers operatively connected to said elongated member at spaced apart locations and said striker corresponding to each key having a different location along said elongated member with unequal distances from said pair of transducers.

21. The apparatus as defined in claim 20 wherein said discriminating means are responsive to production of said leading signal by a discrete one of said pair of transducers.

22. In a keyboard having at least two keybuttons, a device for providing a signal representative of the keybutton which is activated, which device comprises:
a member for transmitting vibratory energy, said member having a midpoint,
a plurality of means activated by said keybuttons for imparting vibratory energy to said member, said means being disposed along said member about said midpoint with at least one of said plurality on an opposite side thereof, and each said means being at a discrete distance from said midpoint;
means for detecting said transmitted energy at two spaced apart points in a temporal sequence determined by location of said activating means relative to said midpoint, said detecting means having respective outputs coupled to
means for providing a signal representative of the difference in time of arrival of said transmitted vibratory energy at said detecting means, whereby a unique signal is obtained for each keybutton activated, said signal providing means operating independently of said sequence.

23. A keyboard as defined in claim 22, wherein said plurality of means are disposed along said member in substantially equal numbers to each side of said midpoint.

24. A keyboard as defined in claim 22, wherein said vibratory energy is acoustic energy, said signal is a unique code representative of the keybutton activated, said member is elongated and rectilinear, with said midpoint defining first and second halves of the member; said keybutton activated means comprises a plurality of strikers, one corresponding to each said keybutton and substantially half of the strikers being present in each said half of the member, each said striker being adapted to impact said member in response to activation of the corresponding keybutton and the resultant acoustic energy forming separate wave fronts travelling in diverging directions; said detecting means comprise first and second means operatively connected to a respective end of said member for transducing said wave fronts into a leading and a following signal with an elapsed time therebetween; and said signal providing means are connected to said transducing means and include means to generate said unique code representative of each key from said elapsed time, said code generating means being effective when said leading signal is transduced by said first transducing means and also when transduced by said second transducing means.

25. The apparatus defined in claim 24, wherein said code generating means includes an OR-gate input from said first and second transducing means.

26. An apparatus for generating signals representative of a mechanical motion comprising:
a member for transmitting vibratory energy, said member having a midpoint;
a plurality of means for imparting vibratory energy to said member, each selectively activatable in response to said mechanical motion, said means being disposed adjacent said member with each being at a discrete distance from said midpoint and at least one of said plurality being on an opposite side of said midpoint,
means for detecting said transmitted energy at two spaced apart points in a temporal sequence determined by location of said activating means relative to said midpoint, said detecting means having respective outputs;
means connected to said outputs for providing a signal representative of the difference in time of arrival of said transmitted vibratory energy at said detecting means, whereby a unique signal is obtained upon each selective activation of one of said plurality of means, said signal providing means being operative irrespective of said sequence.

27. An apparatus as defined in claim 26, wherein said plurality of means are disposed along said member in substantially equal numbers to each side of said midpoint.

28. An apparatus as defined in claim 27, wherein said vibratory energy is acoustic energy, said signal is a unique code representative of the selected one of said plurality of means, said member is elongated and rectilinear, said plurality of energy imparting means comprises a number of strikers, each said striker being adapted to impact said member in response to said mechanical motion and the resultant acoustic energy forming separate wave fronts traveling in diverging directions; said detecting means comprise first and second means operatively connected to a respective end of said member for transducing said wave fronts into a leading and a following signal with an elapsed time therebetween; and said signal providing means include code generating means responsive to said elapsed time and effective when said leading signal is transduced by said first transducing means and also when transduced by said second transducing means.

29. The apparatus defined in claim 28, wherein said code generating means includes an Or-gate input from said first and second transducing means.

* * * * *